United States Patent
Ebuchi et al.

(10) Patent No.: US 6,392,462 B2
(45) Date of Patent: May 21, 2002

(54) MULTIPHASE CLOCK GENERATOR AND SELECTOR CIRCUIT

(75) Inventors: Tsuyoshi Ebuchi; Takefumi Yoshikawa, both of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/824,220

(22) Filed: Apr. 3, 2001

(30) Foreign Application Priority Data

Apr. 4, 2000 (JP) ........................................ 2000-102665

(51) Int. Cl.⁷ .................................................. H03K 3/00
(52) U.S. Cl. ...................... 327/295; 327/237; 327/258; 327/115; 331/45
(58) Field of Search .................. 327/291, 293, 327/295–297, 161, 144, 153, 165, 115, 117, 231, 258, 237; 365/233, 233.5; 331/45, 51; 377/47, 48

(56) References Cited

U.S. PATENT DOCUMENTS 5,477,181 A * 12/1995 Li et al. ..................... 327/258
5,847,588 A * 12/1998 McDermott ................. 327/144
5,903,176 A *  5/1999 Westgate .................... 327/295

FOREIGN PATENT DOCUMENTS

JP          10-65521         3/1998

* cited by examiner

Primary Examiner—Terry D. Cunningham
Assistant Examiner—Minh Nguyen
(74) Attorney, Agent, or Firm—McDermott, Will & Emery

(57) ABSTRACT

A multiphase clock generator includes oscillator, selector circuit and frequency divider circuit. The oscillator generates a first multiphase clock having a first phase difference. The selector circuit receives the first multiphase clock from the oscillator and outputs a second multiphase clock including a plurality of clock signals. In the second multiphase clock, the phase of each clock signal is shifted from that of the previous one by a second phase difference. The second phase difference is n times as long as the first phase difference, where n is a predetermined positive integer. And the frequency divider circuit receives the second multiphase clock from the selector circuit, divides the frequency of the second multiphase clock by a predetermined number and then outputs a group of clock signals with the divided frequency as a third multiphase clock.

8 Claims, 25 Drawing Sheets

FIG. 13

| PHASE DIFFERENCE | PHSEL[0:3] | | | | ENPH1[0:9] | | | | | | | | | | PH1M |
|---|---|---|---|---|---|---|---|---|---|---|---|---|---|---|---|
| 1ns | 1 | 0 | 0 | 0 | 0 | 0 | 0 | 0 | 0 | 0 | 0 | 0 | 0 | 1 | PHA1 |
| 2ns | 0 | 1 | 0 | 0 | 0 | 0 | 0 | 0 | 0 | 0 | 0 | 0 | 0 | 1 | PHA1 |
| 4ns | 0 | 0 | 1 | 0 | 0 | 0 | 0 | 0 | 0 | 0 | 0 | 0 | 0 | 1 | PHA1 |
| 8ns | 0 | 0 | 0 | 1 | 0 | 0 | 0 | 0 | 0 | 0 | 0 | 0 | 0 | 1 | PHA1 |

FIG. 14

| PHASE DIFFERENCE | PHSEL[0:3] | | | | ENPH2[0:9] | | | | | | | | | | PH2M |
|---|---|---|---|---|---|---|---|---|---|---|---|---|---|---|---|
| 1ns | 1 | 0 | 0 | 0 | 0 | 0 | 0 | 0 | 0 | 0 | 0 | 0 | 1 | 0 | PHA2 |
| 2ns | 0 | 1 | 0 | 0 | 0 | 0 | 0 | 0 | 0 | 0 | 0 | 1 | 0 | 0 | PHA3 |
| 4ns | 0 | 0 | 1 | 0 | 0 | 0 | 0 | 0 | 0 | 1 | 0 | 0 | 0 | 0 | PHA5 |
| 8ns | 0 | 0 | 0 | 1 | 0 | 1 | 0 | 0 | 0 | 0 | 0 | 0 | 0 | 0 | PHA9 |

FIG. 15

| PHASE DIFFERENCE | PHSEL[0:3] | | | | ENPH3[0:9] | | | | | | | | | | PH3M |
|---|---|---|---|---|---|---|---|---|---|---|---|---|---|---|---|
| 1ns | 1 | 0 | 0 | 0 | 0 | 0 | 0 | 0 | 0 | 0 | 1 | 0 | 0 | 0 | PHA3 |
| 2ns | 0 | 1 | 0 | 0 | 0 | 0 | 0 | 0 | 0 | 1 | 0 | 0 | 0 | 0 | PHA5 |
| 4ns | 0 | 0 | 1 | 0 | 0 | 1 | 0 | 0 | 0 | 0 | 0 | 0 | 0 | 0 | PHA9 |
| 8ns | 0 | 0 | 0 | 1 | 0 | 0 | 0 | 1 | 0 | 0 | 0 | 0 | 0 | 0 | PHA7 |

FIG. 16

| PHASE DIFFERENCE | PHSEL[0:3] | | | | ENPH4[0:9] | | | | | | | | | | PH4M |
|---|---|---|---|---|---|---|---|---|---|---|---|---|---|---|---|
| 1ns | 1 | 0 | 0 | 0 | 0 | 0 | 0 | 0 | 0 | 0 | 1 | 0 | 0 | 0 | PHA4 |
| 2ns | 0 | 1 | 0 | 0 | 0 | 0 | 0 | 0 | 1 | 0 | 0 | 0 | 0 | 0 | PHA7 |
| 4ns | 0 | 0 | 1 | 0 | 0 | 0 | 0 | 0 | 0 | 0 | 0 | 1 | 0 | 0 | PHA3 |
| 8ns | 0 | 0 | 0 | 1 | 0 | 0 | 0 | 0 | 0 | 1 | 0 | 0 | 0 | 0 | PHA5 |

FIG. 17

| PHASE DIFFERENCE | PHSEL[0:3] | ENPH5[0:9] | PH5M |
|---|---|---|---|
| 1ns | 1 0 0 0 | 0 0 0 0 0 1 0 0 0 0 | PHA5 |
| 2ns | 0 1 0 0 | 0 1 0 0 0 0 0 0 0 0 | PHA9 |
| 4ns | 0 0 1 0 | 0 0 0 1 0 0 0 0 0 0 | PHA7 |
| 8ns | 0 0 0 1 | 0 0 0 0 0 0 0 1 0 0 | PHA3 |

FIG. 18

| PHASE DIFFERENCE | PHSEL[0:3] | ENPH6[0:9] | PH6M |
|---|---|---|---|
| 1ns | 1 0 0 0 | 0 0 0 0 1 0 0 0 0 0 | PHA6 |
| 2ns | 0 1 0 0 | 0 0 0 0 0 0 0 0 0 1 | PHA1 |
| 4ns | 0 0 1 0 | 0 0 0 0 0 0 0 0 0 1 | PHA1 |
| 8ns | 0 0 0 1 | 0 0 0 0 0 0 0 0 0 1 | PHA1 |

FIG. 19

| PHASE DIFFERENCE | PHSEL[0:3] | ENPH7[0:9] | PH7M |
|---|---|---|---|
| 1ns | 1 0 0 0 | 0 0 0 1 0 0 0 0 0 0 | PHA7 |
| 2ns | 0 1 0 0 | 0 0 0 0 0 0 0 1 0 0 | PHA3 |
| 4ns | 0 0 1 0 | 0 0 0 0 1 0 0 0 0 0 | PHA5 |
| 8ns | 0 0 0 1 | 0 1 0 0 0 0 0 0 0 0 | PHA9 |

FIG. 20

| PHASE DIFFERENCE | PHSEL[0:3] | ENPH8[0:9] | PH8M |
|---|---|---|---|
| 1ns | 1 0 0 0 | 0 0 1 0 0 0 0 0 0 0 | PHA8 |
| 2ns | 0 1 0 0 | 0 0 0 0 0 1 0 0 0 0 | PHA5 |
| 4ns | 0 0 1 0 | 0 1 0 0 0 0 0 0 0 0 | PHA9 |
| 8ns | 0 0 0 1 | 0 0 0 1 0 0 0 0 0 0 | PHA7 |

FIG. 21

| PHASE DIFFERENCE | PHSEL[0:3] | ENPH9[0:9] | PH9M |
|---|---|---|---|
| 1ns | 1 0 0 0 | 0 1 0 0 0 0 0 0 0 0 | PHA9 |
| 2ns | 0 1 0 0 | 0 0 0 1 0 0 0 0 0 0 | PHA7 |
| 4ns | 0 0 1 0 | 0 0 0 0 0 0 1 0 0 | PHA3 |
| 8ns | 0 0 0 1 | 0 0 0 0 1 0 0 0 0 | PHA5 |

FIG. 22

| PHASE DIFFERENCE | PHSEL[0:3] | ENPH10[0:9] | PH10M |
|---|---|---|---|
| 1ns | 1 0 0 0 | 1 0 0 0 0 0 0 0 0 0 | PHA10 |
| 2ns | 0 1 0 0 | 0 1 0 0 0 0 0 0 0 0 | PHA9 |
| 4ns | 0 0 1 0 | 0 0 1 0 0 0 0 0 0 0 | PHA7 |
| 8ns | 0 0 0 1 | 0 0 0 0 0 0 1 0 0 | PHA3 |

FIG. 23

| PHASE DIFFERENCE | PHSEL[0:3] | | | | PH1M (801) | PH2M (802) | PH3M (803) | PH4M (804) | PH5M (805) | PH6M (806) | PH7M (807) | PH8M (808) | PH9M (809) | PH10M (810) |
|---|---|---|---|---|---|---|---|---|---|---|---|---|---|---|
| 1ns | 1 | 0 | 0 | 0 | PHA1 | PHA2 | PHA3 | PHA4 | PHA5 | PHA6 | PHA7 | PHA8 | PHA9 | PHA10 |
| 2ns | 0 | 1 | 0 | 0 | PHA1 | PHA3 | PHA5 | PHA7 | PHA9 | PHA1 | PHA3 | PHA5 | PHA7 | PHA9 |
| 4ns | 0 | 0 | 1 | 0 | PHA1 | PHA5 | PHA9 | PHA3 | PHA7 | PHA1 | PHA5 | PHA9 | PHA3 | PHA7 |
| 8ns | 0 | 0 | 0 | 1 | PHA1 | PHA9 | PHA7 | PHA5 | PHA3 | PHA1 | PHA9 | PHA7 | PHA5 | PHA3 |

| FREQUENCY DIVISION RATIO | DIVSE0 | DIVSE1 | ENDIV0 | ENDIV1 | ENDIV2 | ENDIV3 |
|---|---|---|---|---|---|---|
| 1/1 | 0 | 0 | 1 | 0 | 0 | 0 |
| 1/2 | 0 | 1 | 0 | 1 | 0 | 0 |
| 1/4 | 1 | 0 | 0 | 0 | 1 | 0 |
| 1/8 | 1 | 1 | 0 | 0 | 0 | 1 |

FIG. 30

| ENPH1[0:9] | ( 0 0 0 0 0 0 0 0 0 1 ) | PH1(NI1) |
|---|---|---|
| ENPH2[0:9] | ( 0 0 0 1 0 0 0 0 0 0 ) | PH7(NI2) |
| ENPH3[0:9] | ( 0 0 0 0 0 0 0 1 0 0 ) | PH3(NI3) |
| ENPH4[0:9] | ( 0 1 0 0 0 0 0 0 0 0 ) | PH9(NI4) |
| ENPH5[0:9] | ( 0 0 0 0 0 1 0 0 0 0 ) | PH5(NI5) |
| ENPH6[0:9] | ( 0 0 0 0 0 0 0 0 0 1 ) | PH1(NI6) |
| ENPH7[0:9] | ( 0 0 0 1 0 0 0 0 0 0 ) | PH7(NI7) |
| ENPH8[0:9] | ( 0 0 0 0 0 0 0 1 0 0 ) | PH3(NI8) |
| ENPH9[0:9] | ( 0 1 0 0 0 0 0 0 0 0 ) | PH9(NI9) |
| ENPH10[0:9] | ( 0 0 0 0 0 1 0 0 0 0 ) | PH5(NI10) |

MULTIPHASE CLOCK GENERATOR AND SELECTOR CIRCUIT

BACKGROUND OF THE INVENTION

The present invention generally relates to a multiphase clock generator and a selector circuit, and more particularly relates to a multiphase clock generator and selector circuit effectively applicable to a circuit that deals with multiple discrete frequencies in a wide range.

Where a high-speed serial data transmitter, complying with the IEEE 1394.b, for example, is made up of CMOS devices, a group of clock signals in multiple different phases some-times needs to be generated to lower the operating frequencies of the respective CMOS devices. A group of clock signals in multiple different phases will be herein called a "multiphase clock" collectively. For example, a "10-phase clock" means a group of ten clock signals in mutually different phases. Specifically, ten 100 MHz clock signals, each having its phase shifted from the previous one by 10 ns, are generated instead of a single 1 GHz clock signal so that the respective CMOS devices can operate in parallel to each other responsive to this 10-phase clock. In this manner, the operating frequency of each CMOS device can be lowered and a high-speed data transmitter is implementable as a set of CMOS devices. Normally, a multiphase clock like this is generated using a PLL circuit.

As shown in FIG. 31, the loop of a PLL circuit includes a programmable frequency divider PD that can change its frequency division ratio. Using this programmable frequency divider PD, the PLL circuit changes the frequency division ratio and thereby changes the oscillation frequency of its voltage-controlled oscillator VCO. In this manner, a multiphase clock, consisting of ten clock signals PHB1 through PHB10 in various combinations, can be generated.

However, an IEEE 1394.b-compliant high-speed serial data transmitter has operating frequencies that cover a wide range, i.e., 125 Mbps, 250 Mbps, 500 Mbps, 1 Gbps and 2 Gbps. Accordingly, where the multiphase clock generator such as that illustrated in FIG. 31 is applied to such a high-speed serial data transmitter, its VCO must also operate in that wide range correspondingly. For that reason, it is difficult to finely tune the VCO.

It is true that the operating frequencies of an IEEE 1394.b-compliant high-speed serial data transmitter cover a wide range. But those operating frequencies can be nothing but discrete ones. FIG. 32 illustrates a multiphase clock generator utilizing this feature. In the multiphase clock generator shown in FIG. 32, the VCO is made to oscillate at a constant frequency but the frequency is changed using an external frequency divider DIV. Also, in this circuit, each of the ten clock signals PHA1 through PHA10 output from the VCO as a 10-phase clock has its frequency divided by associated one of the ten D-flip-flops DFF included in the frequency divider DIV. Accordingly, there is no need to tune the VCO but just the frequency division ratio of the D-flip-flops DFF should be changed to obtain a 10-phase clock consisting of clock signals PHC1 through PHC10 with a desired frequency.

In the multiphase clock generator shown in FIG. 32, however, the phase difference between two consecutive clock signals of the 10-phase clock PHA1 through PHA10 output from the VCO is equal to the difference between two consecutive ones of the 10-phase clock PHC1 through PHC10 output from the frequency divider DIV. For example, suppose the 10-phase clock PHA1 through PHA10 has a phase difference of 1 ns and a frequency of 100 MHz. In that case, the 10-phase clock PHC1 through PHC10 with a frequency of 50 MHz has waveforms as shown in FIG. 33. Referring to FIG. 33, the phase difference of the 10-phase clock PHC1 through PHC10 is also 1 ns, which is equal to that of the 10-phase clock PHA1 through PHA10.

Accordingly, the multiphase clock generator shown in FIG. 32 cannot obtain a multiphase clock PHC1 through PHC10 having a desired phase difference.

SUMMARY OF THE INVENTION

It is therefore an object of the present invention to provide a multiphase clock generator that can obtain a multiphase clock having a desired frequency and a desired phase difference.

A multiphase clock generator according to an aspect of the present invention includes oscillator, first selecting means and frequency dividing means. The oscillator generates a first multiphase clock having a predetermined frequency and including a number of clock signals. In the first multiphase clock, the phase of each clock signal is shifted from that of the previous one by a first phase difference. The first selecting means receives the first multiphase clock from the oscillator and outputs a second multiphase clock including the same or a different number of clock signals. In the second multiphase clock, the phase of each clock signal is shifted from that of the previous one by a second phase difference. The second phase difference is n times as long as the first phase difference, where n is a predetermined positive integer. And the frequency dividing means receives the second multiphase clock from the first selecting means, divides the frequency of the second multiphase clock by a predetermined number and then outputs a group of clock signals with the divided frequency as a third multiphase clock.

In the inventive multiphase clock generator, the phase difference of the third multiphase clock is equal to that of the second multiphase clock output from the first selecting means. In other words, the phase difference of the third multiphase clock is determined by the first selecting means. Accordingly, by adjusting the integer n to be multiplied together with the first phase difference by the first selecting means, the third multiphase clock can have a desired phase difference. For that reason, no fine adjustment is needed for the oscillator.

Also, the frequency of the third multiphase clock is obtained by having the predetermined frequency of the first multiphase clock divided by the frequency dividing means at a certain ratio. Accordingly, by adjusting the frequency division ratio of the frequency dividing means, the third multiphase clock can have a desired frequency.

In one embodiment of the present invention, the frequency dividing means preferably includes a plurality of frequency dividing units. A first one of the units is associated with a first one of the clock signals included in the second multiphase clock received from the first selecting means. And the first unit preferably divides the frequency of the first clock signal by the predetermined number after a second one of the units, which is associated with a second one of the clock signals that has a phase lead over the first clock signal by the second phase difference, has started to divide the frequency of the second clock signal.

In such an embodiment, even if one of the clock signals in the second multiphase clock output from the first selecting means is in phase with another one of the clock signals, it is possible to prevent two frequency dividing units, associated with these clock signals, from starting the frequency division at the same time.

In this particular embodiment, each said frequency dividing unit preferably includes a single- or multi-stage flip-flop and inverting means. The flip-flop preferably includes a clock terminal, at which an associated one of the clock signals is received. The inverting means preferably inverts an output at a last stage of the flip-flop and then supplies the inverted output to an input terminal at an initial stage of the flip-flop. And the inverting means of the first unit is activated when an output at a last stage of a flip-flop, included in the second unit associated with the second clock signal, changes. The second clock signal has the phase lead over the first clock signal, associated with the first unit, by the second phase difference.

In such an embodiment, while the last-stage output of the flip-flop in the second unit does not change, the inverting means of the first unit is deactivated and the initial-stage input of the flip-flop in the first unit has a fixed value. Accordingly, the last-stage output of the flip-flop in the first unit also has a fixed value. And it is not until the last-stage output of the flip-flop in the second unit changes that the inverting means of the first unit is activated. When the inverting means of the first unit is activated, an inverted version of the last-stage output of the flip-flop in the first unit is supplied to the initial-stage input terminal of the flip-flop in the first unit. As a result, the first unit starts to divide the frequency.

In another embodiment of the present invention, the first selecting means preferably changes the integer n responsive to an external signal.

In still another embodiment, the frequency dividing means preferably divides the frequency of the second multiphase clock, received from the first selecting means, at a ratio corresponding to an external signal.

In yet another embodiment, the multiphase clock generator preferably further includes clock synthesizing means for generating a serial clock signal from the third multiphase clock that has been received from the frequency dividing means.

In this particular embodiment, the clock synthesizing means preferably includes a first type of logic circuits and a second type of logic circuit. Each said logic circuit of the first type generates a pulse signal from an associated one of the clock signals included in the third multiphase clock received from the frequency dividing means and an inverted version of another one of the clock signals that has a phase shifted from the associated clock signal by the second phase difference. The pulse signal has a pulse width equal to the second phase difference and also has a period equal to that of the third multiphase clock. The second type of logic circuit synthesizes the pulse signals output from the logic circuits of the first type.

A multiphase clock generator according to this embodiment can obtain the third multiphase clock and a serial clock signal. Accordingly, where a block for performing parallel processing using a multiphase clock and a block for performing serial processing using a serial clock signal coexist on the same LSI chip, the clock generator can supply both the multiphase clock and serial clock signal. Normally, a circuit for generating a serial clock signal should be provided separately in such a case, and the serial clock generator separately provided needs an internal PLL. In contrast, the clock synthesizing means of the present invention needs no PLL. As a result, the chip area occupied can be saved and the cost can be cut down eventually.

In this particular embodiment, the clock synthesizing means preferably further includes second selecting means.

The second selecting means supplies first and second clock signals to each of the logic circuits of the first type. The first clock signal is one of the clock signals, which is included in the third multiphase clock received from the frequency dividing means and which is associated with the logic circuit of the first type. The second clock signal is complementary to a clock signal that has a phase shifted from the first clock signal by the second phase difference. And each said logic circuit of the first type preferably generates the pulse signal responsive to the first and second clock signals supplied from the second selecting means.

In such an embodiment, a delay caused on a path through which the first clock signal is supplied to one of the logic circuits of the first type is no different from a delay caused on a path through which the second clock signal is supplied to the logic circuit. As a result, a serial clock signal with a 50—50 duty can be obtained.

A selector circuit according to another aspect of the present invention receives a first multiphase clock and outputs a second multiphase clock. The first multiphase clock has a predetermined frequency and includes a number of clock signals. In the first multiphase clock, the phase of each clock signal is shifted from that of the previous one by a first phase difference. The second multiphase clock includes the same or a different number of clock signals. In the second multiphase clock, the phase of each clock signal is shifted from that of the previous one by a second phase difference. The second phase difference is n times as long as the first phase difference, where n is a predetermined positive integer.

In one embodiment of the present invention, the selector circuit changes the integer n responsive to an external signal.

BRIEF DESCRIPTION OF THE DRAWINGS

FIGS. 13 through 22 illustrate relationships between the select signals supplied from the decoders shown in FIG. 12 and the clock signals output from the selectors.

FIG. 23 illustrates relationships between the select signals supplied to the selector circuit shown in FIG. 11 and the clock signals output from the selector circuit.

FIG. 30 illustrates relationships between the select signals supplied from the decoders shown in FIG. 29 and the outputs of the selectors.

DESCRIPTION OF THE PREFERRED EMBODIMENTS

Figure 1:
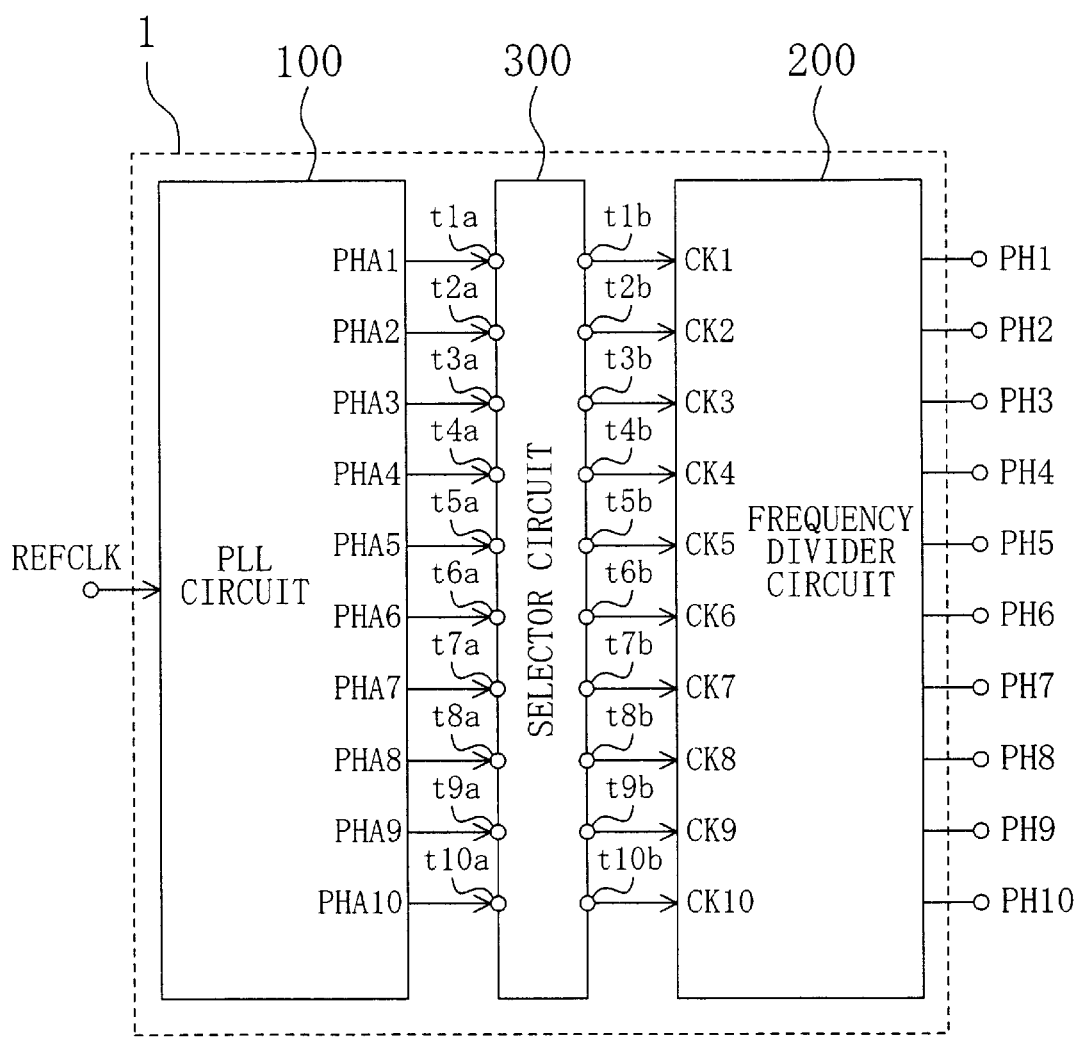
FIG. 1 is a block diagram illustrating an overall configuration for a multiphase clock generator according to a first embodiment of the present invention.

Hereinafter, preferred embodiments of the present invention will be described in detail with reference to the accompanying drawings, in which components having like or the same function will be identified by the same reference numeral for the sake of simplicity of description.

Embodiment 1

FIG. 1 is a block diagram illustrating an overall configuration for a multiphase clock generator according to a first embodiment of the present invention. As shown in FIG. 1, the multiphase clock generator 1 includes PLL circuit 100, frequency divider circuit 200 and selector circuit 300.

Responsive to a reference clock signal REFCLK, the PLL circuit 100 generates a 10-phase clock consisting of clock signals PHA1 through PHA10 having a phase difference of 1 ns and a frequency of 100 MHz. In the illustrated embodiment, the frequency of the reference clock signal REFCLK is 25 MHz.

Figure 2:
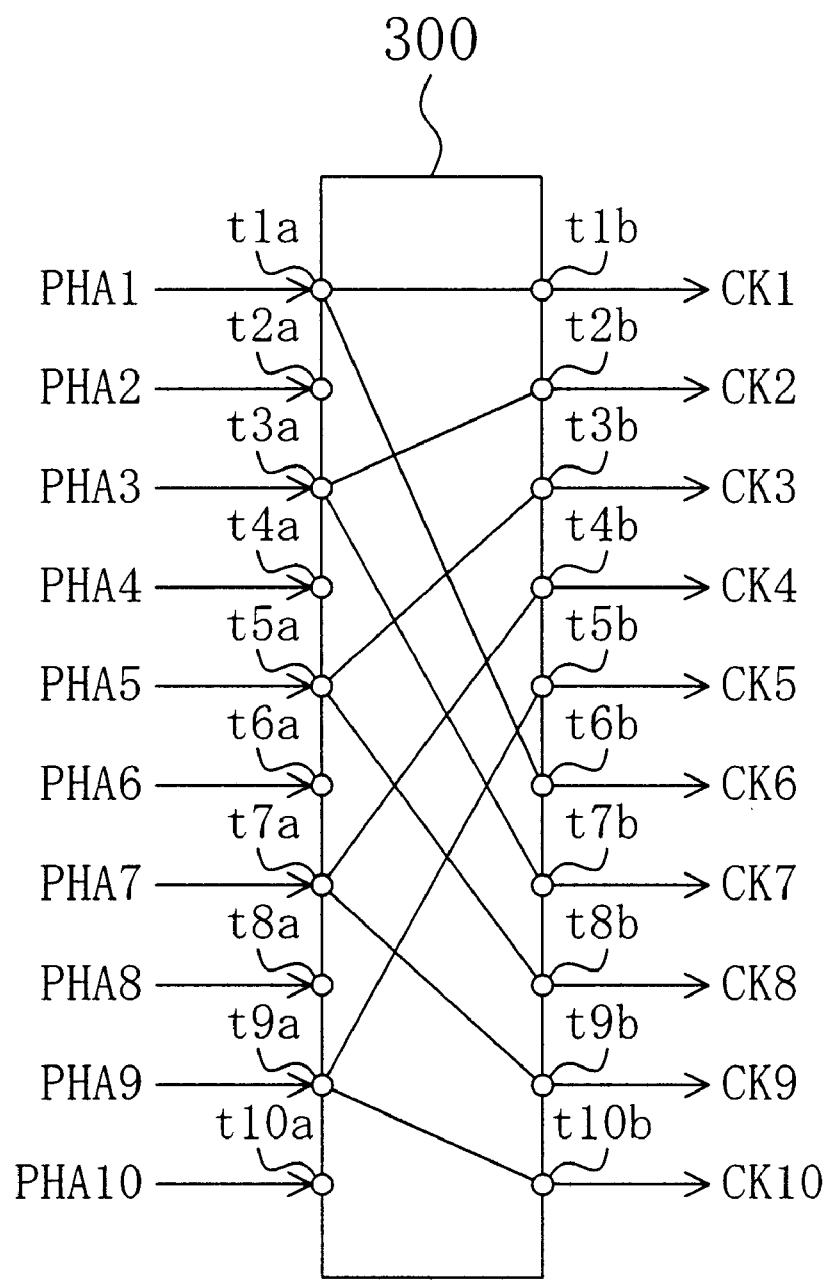
FIG. 2 illustrates how the input and output terminals of the selector circuit shown in FIG. 1 may be connected together.

The selector circuit 300 includes input terminals t1a through t10a and output terminals t1b through t10b. The clock signals PHA1 through PHA10 output from the PLL circuit 100 are received at the input terminals t1a through t10a, respectively. The input and output terminals of the selector circuit 300 are connected together so that each pair of output terminals t1b through t10b receives two associated ones of the clock signals PHA1 through PHA10 in the 10-phase clock and that the two clock signals have a phase difference of 2 ns. Specifically, as shown in FIG. 2, the input terminal t1a may be connected to the output terminals t1b and t6b, the input terminal t3a to the output terminals t2b and t7b, the input terminal t5a to the output terminals t3b and t8b, the input terminal t7a to the output terminals t4b and t9b and the input terminal t9a to the output terminals t5b and t10b, respectively.

The frequency divider circuit 200 divides the frequency of the clock signals CK1 through CK10, output from the selector circuit 300, by two, thereby generating a 10-phase clock consisting of clock signals PH1 through PH10 having a phase difference of 2 ns and a frequency of 50 MHz.

Figure 3:
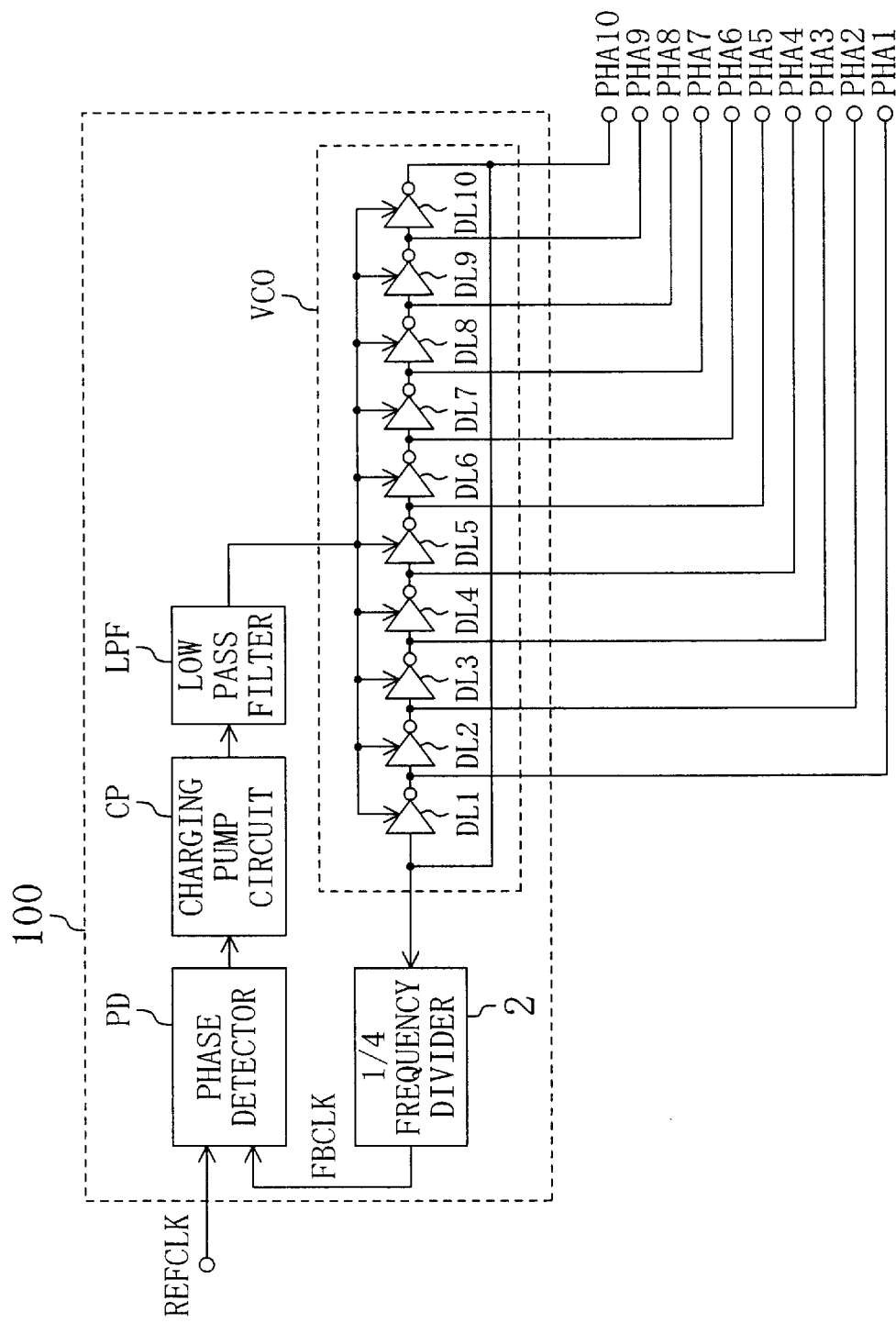
FIG. 3 is a block diagram illustrating a specific configuration for the PLL circuit shown in FIG. 1.

FIG. 3 is a block diagram illustrating a specific configuration for the PLL circuit 100 shown in FIG. 1. As shown in FIG. 3, the PLL circuit 100 includes phase detector PD, charging pump circuit CP, low pass filter LPF, voltage-controlled oscillator VCO and 1/4 frequency divider 2.

The phase detector PD receives the reference clock signal REFCLK with a frequency of 25 MHz and a feedback clock signal FBCLK, thereby generating an error signal in accordance with a phase difference between the reference and feedback clock signals REFCLK and FBCLK. The charging pump circuit CP outputs a voltage corresponding to the error signal supplied from the phase detector PD. The low pass filter LPF removes high-frequency components from the output voltage of the charging pump circuit CP. The voltage-controlled oscillator VCO includes inverters DL1 through DL10, which are connected together to form a ring, and outputs the signals PHA1 through PHA10 at an oscillation frequency (i.e., 100 MHz in this example) corresponding to the output voltage of the low pass filter LPF. The 1/4 frequency divider 2 divides the output signal of the inverter DL10 by four and then supplies the frequency-divided signal as the feedback clock signal FBCLK to the phase detector PD.

Figure 4:
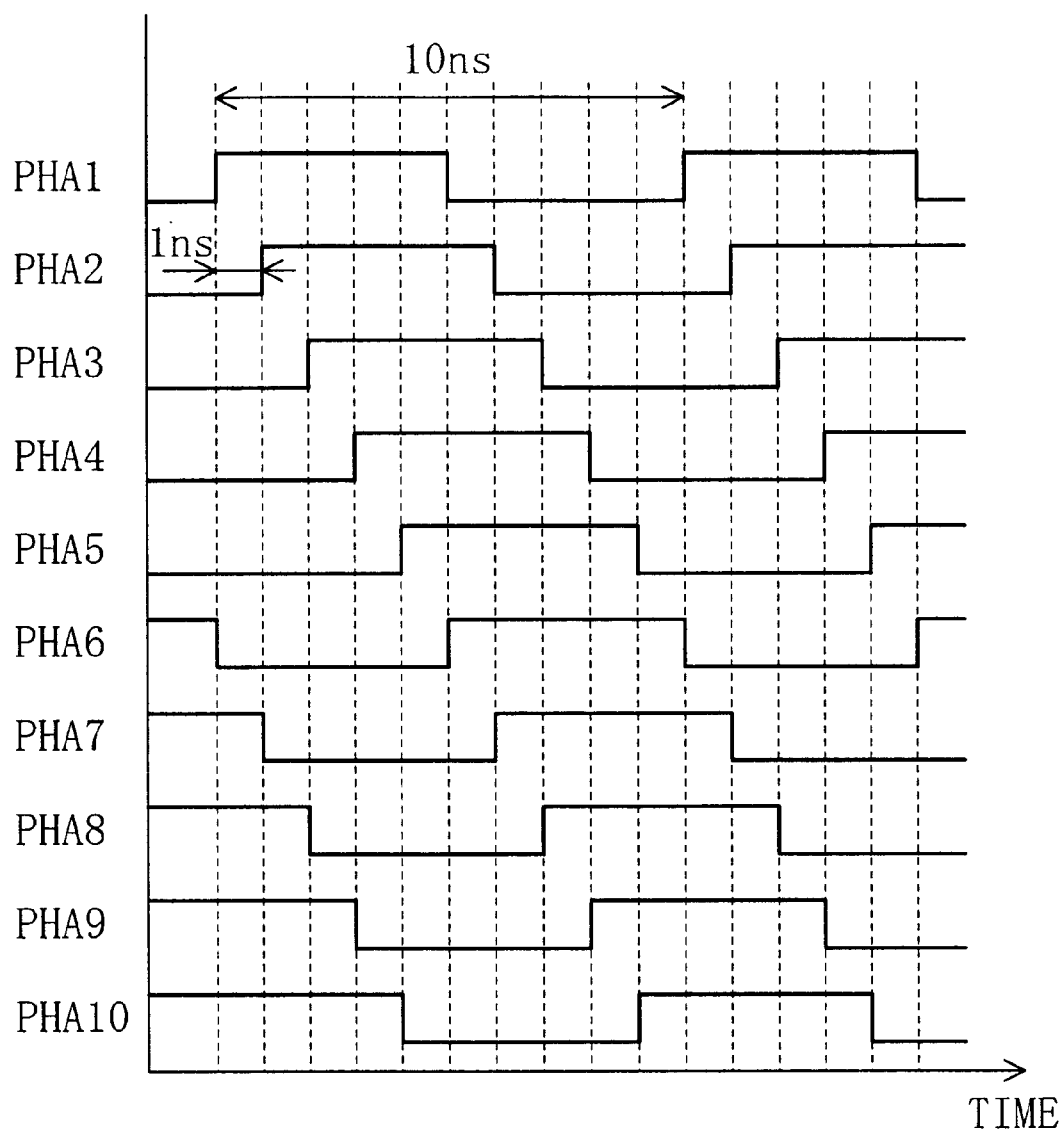
FIG. 4 is a timing diagram illustrating the respective waveforms of the clock signals included in the 10-phase clock output from the PLL circuit shown in FIG. 3.

In the PLL circuit 100 with such a configuration, the output signals of the inverters DL1 through DL10 are the clock signals PHA1 through PHA10, respectively. Accordingly, as shown in FIG. 4, a clock signal PHA(i+1) (where $1 \leq i \leq 9$) has a phase shifted from that of the previous clock signal PHAi by the delay caused by the associated inverter DLi (i.e., 1 ns in this example).

Figure 5:
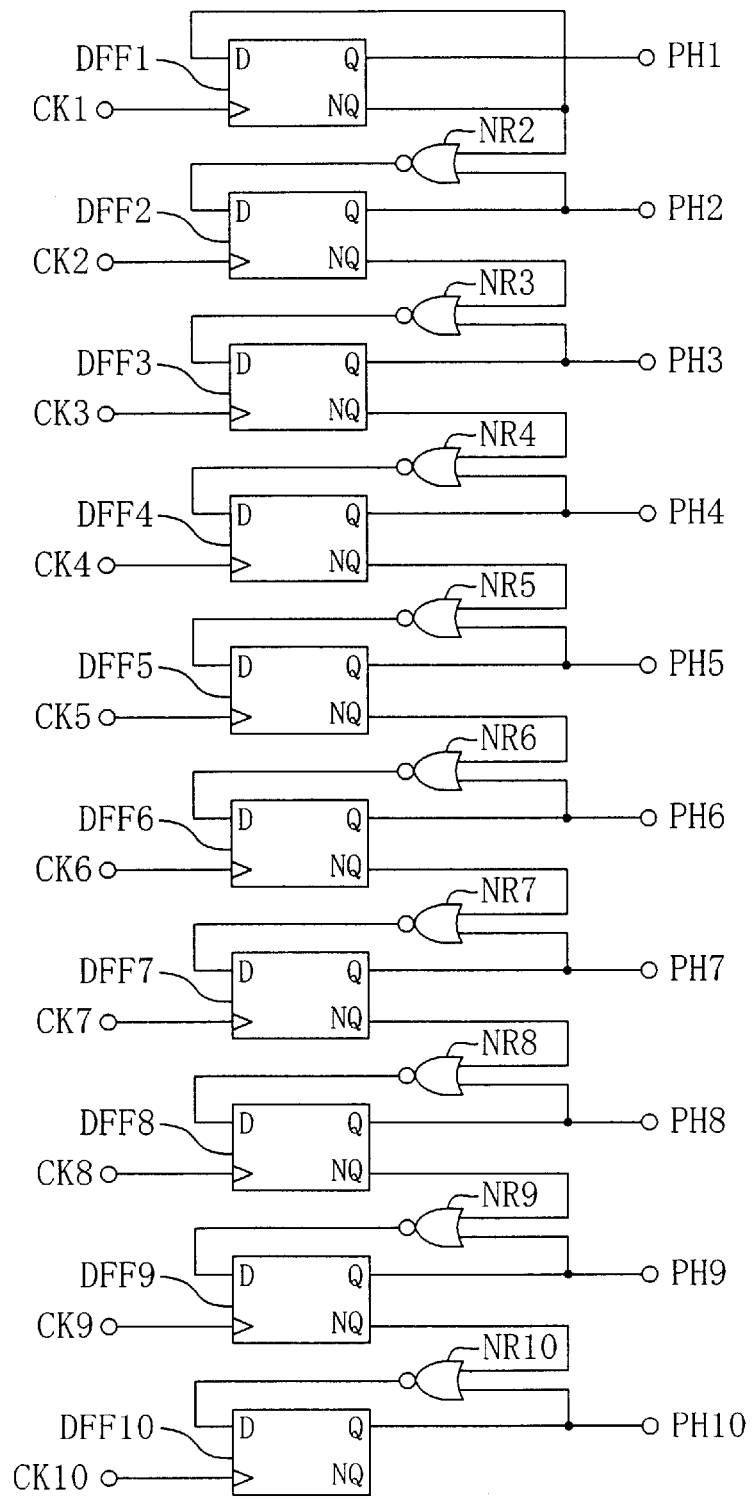
FIG. 5 is a block diagram illustrating a configuration for the frequency divider circuit shown in FIG. 1.

FIG. 5 is a block diagram illustrating a configuration for the frequency divider 200 shown in FIG. 1. As shown in FIG. 5, the frequency divider 200 includes D-flip-flops DFF1 through DFF10 and NOR gates NR2 through NR10. In this embodiment, a D-flip-flop DFFi and an associated NOR gate NRi (where $2 \leq i \leq 10$) together makes up a frequency dividing unit.

A NOR gate NRi (where $2 \leq i \leq 10$) outputs the negated logical sum NOR of the inverted output NQ of an associated D-flip-flop DFF(i−1) and the output Q of another associated D-flip-flop DFFi. The output of the NOR gate NRi (where $2 \leq i \leq 10$) is fed back to the input terminal D of the associated D-flip-flop DFFi. The inverted output NQ of the D-flip-flop DFF1 is fed back to the input terminal D of the D-flip-flop DFF1. The clock signals CK1 through CK10, output from the selector circuit 300 shown in FIG. 1, are supplied to the clock terminals of the D-flip-flops DFF1 through DFF10, respectively. The outputs Q of these D-flip-flops DFF1 through DFF10 will be the clock signals PH1 through PH10, respectively.

In the frequency divider circuit 200 with such a configuration, the clock signals CK1 through CK10 have their frequency divided by two by the D-flip-flops DFF1 through DFF10, respectively. As a result, the 10-phase clock, consisting of the clock signals PH1 through PH10 having a phase difference of 2 ns and a frequency of 50 MHz, is output.

Figure 6:
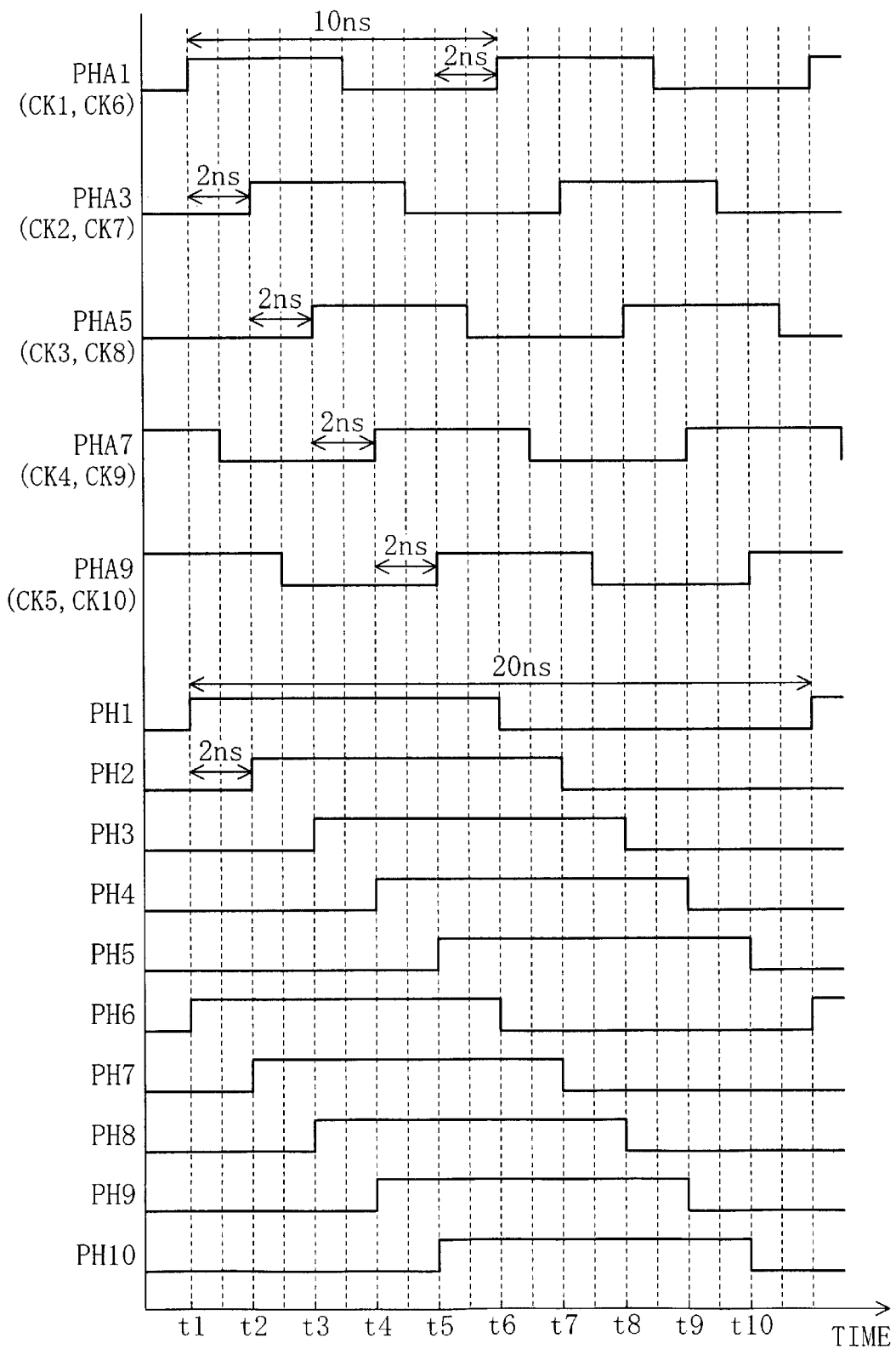
FIGS. 6 and 7 are timing diagrams illustrating how the frequency divider circuit shown in FIG. 5 operates.

In the selector circuit 300 shown in FIG. 2, the clock signal PHA1 is supplied to the output terminals t1b and t6b, the clock signal PHA3 is supplied to the output terminals t2b and t7b, the clock signal PHA5 is supplied to the output terminals t3b and t8b, the clock signal PHA7 is supplied to the output terminals t4b and t9b and the clock signal PHA9 is supplied to the output terminals t5b and t10b. Accordingly, as shown in the upper half of FIG. 6, the clock signals CK1 and CK6 are the same clock signal PHA1, the clock signals CK2 and CK7 are the same clock signal PHA3, the clock signals CK3 and CK8 are the same clock signal PHA5, the clock signals CK4 and CK9 are the same clock signal PHA7 and the clock signals CK5 and CK10 are the same clock signal PHA9. Without the NOR gates NR2 through NR10, the outputs PH1 through PH10 of the D-flip-flops DFF1 through DFF10 will be as shown in the lower half of FIG. 6. As can be seen from FIG. 6, the 10-phase clock, consisting of clock signals having a phase difference of 2 ns, cannot be obtained in such a situation.

Figure 7:
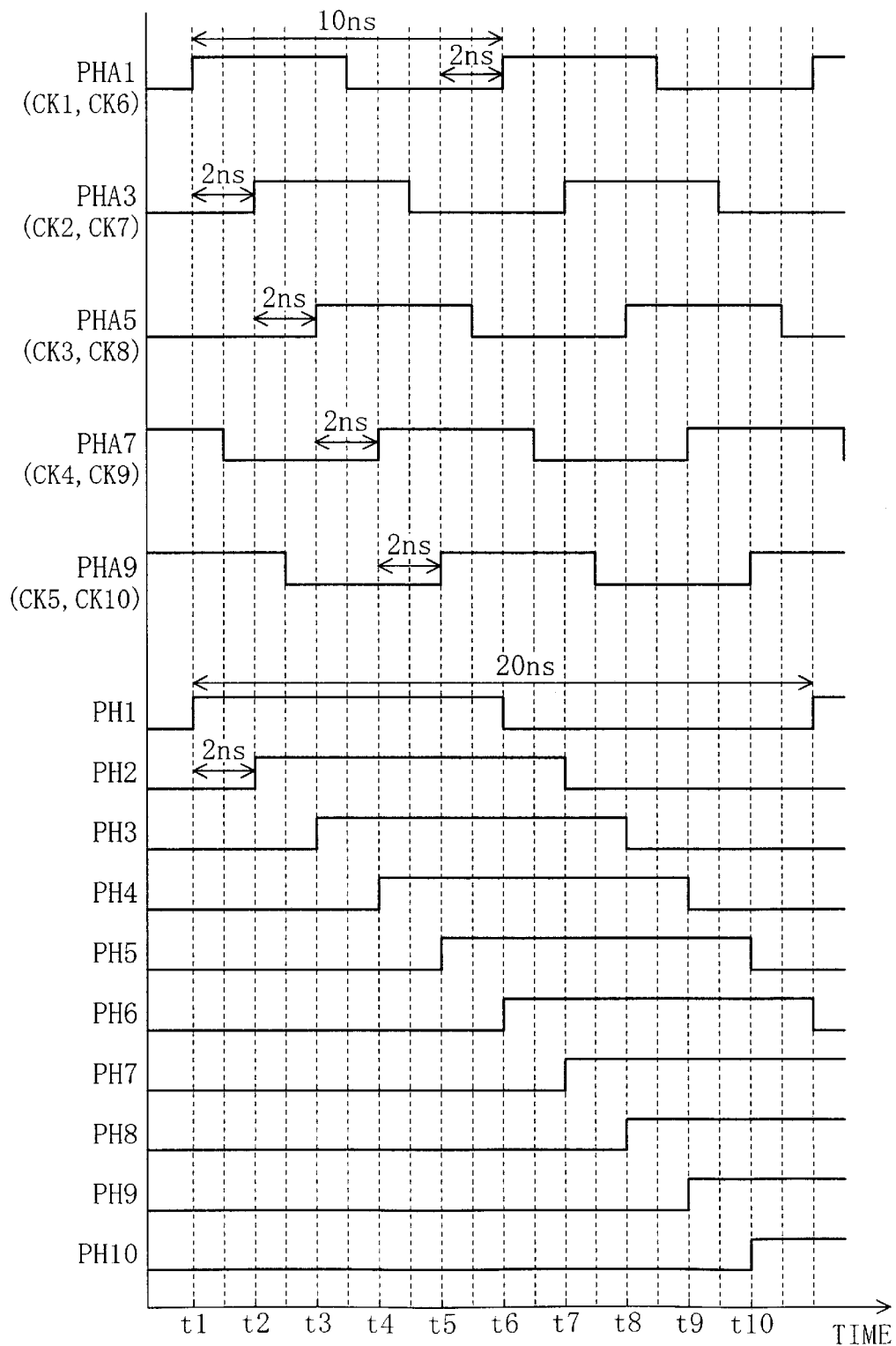

For that reason, to divide each pair of the same two clock signals on the time axis, each of the NOR gates NR2 through NR10 is provided between adjacent ones of the D-flip-flops DFF1 through DFF10. Hereinafter, it will be described with reference to FIGS. 5 and 7 how the frequency divider circuit 200 operates.

In the initial state (i.e., before a time t1), the outputs Q (i.e., PH1 through PH10) of the D-flip-flops DFF1 through DFF10 are in logical zero state (which will be herein called "at L-level"), while the inverted outputs NQ are in logical one state (which will be herein called "at H-level"). Accordingly, the outputs of the NOR gates NR2 through NR10 are fixed at L-level. While the outputs of the NOR gates NR2 through NR10 are at L-level, the outputs Q (i.e., PH2 through PH10) of the D-flip-flops DFF2 through DFF10 are also fixed at L-level no matter whether the clock signals received at the clock terminals are zero or one. That is to say, the D-flip-flops DFF2 through DFF10 do not divide the frequency of the clock signals.

At the time t1, the clock signal CK1 rises to H-level. In response, the output Q (i.e., PH1) of the D-flip-flop DFF1 rises to H-level, while the inverted output NQ thereof falls to L-level. As a result, the output of the NOR gate NR2 rises to H-level. That is to say, the NOR gate NR2 inverts the output Q of the D-flip-flop DFF2 and then supplies the inverted version to the input terminal D of the D-flip-flop DFF2. In response, the D-flip-flop DFF2 starts to divide the frequency of the clock signal CK2.

The clock signal CK6 also rises to H-level at this time t1. However, since the inverted output NQ of the D-flip-flop DFF5 remains high, the output of the NOR gate NR6 is still fixed at L-level. Accordingly, the D-flip-flop DFF6 does not divide the frequency of the clock signal CK6.

At a time t2, the clock signal CK2 rises to H-level. In response, the output Q (i.e., PH2) of the D-flip-flop DFF2 rises to H-level, while the inverted output NQ thereof falls to L-level. As a result, the output of the NOR gate NR3 rises to H-level. That is to say, the NOR gate NR3 inverts the output Q of the D-flip-flop DFF3 and then supplies the inverted version to the input terminal D of the D-flip-flop DFF3. In response, the D-flip-flop DFF3 starts to divide the frequency of the clock signal CK3.

The clock signal CK7 also rises to H-level at this time t2. However, since the inverted output NQ of the D-flip-flop DFF6 remains high, the output of the NOR gate NR7 is still fixed at L-level. Accordingly, the D-flip-flop DFF7 does not divide the frequency of the clock signal CK7.

After that, the D-flip-flops DFF4 through DFF10 will start to divide the frequency of the associated clock signals CK4 through CK10 at times t3 through t10, respectively, through similar level transitions.

In this manner, a 10-phase clock, consisting of clock signals PH1 through PH10 having a phase difference of 2 ns and a frequency of 50 MHz, can be obtained.

As described above, the frequency divider circuit 200 shown in FIG. 5 includes the NOR gates NR2 through NR10. Accordingly, each D-flip-flop DFFi (where $2 \leq i \leq 10$) starts to divide the frequency of its associated clock signal after the previous D-flip-flop DFF(i−1) has started to divide the frequency of its associated clock signal. As a result, the 10-phase clock, consisting of clock signals PH1 through PH10 having a desired phase difference of 2 ns, can be obtained.

Figure 8A:
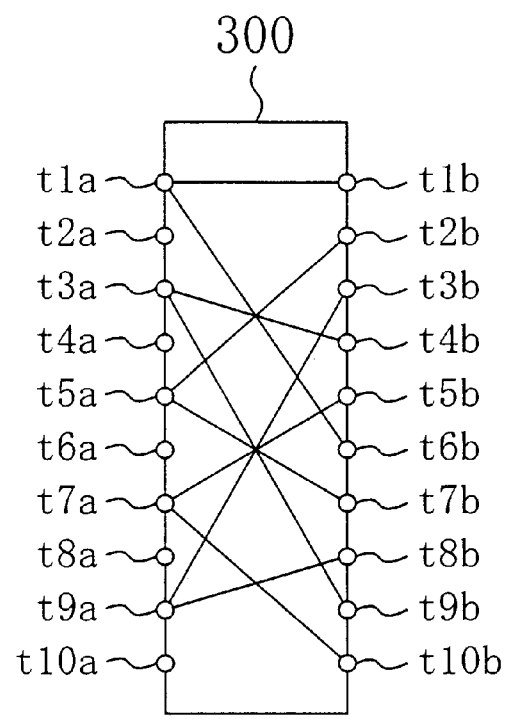
FIGS. 8A and 8B illustrate how the input and output terminals of the selector circuit shown in FIG. 1 may be connected together to obtain a 10-phase clock with a phase difference of 4 ns and a 10-phase clock with a phase difference of 3 ns, respectively.

The foregoing illustrative embodiment of the present invention has been described as being applied to obtaining a 10-phase clock having a phase difference of 2 ns. To obtain a 10-phase clock having a phase difference of 4 ns, the input terminals t1a through t10a and output terminals t1b through t10b of the selector circuit 300 may be connected together as shown in FIG. 8A. Specifically, the input terminal t1a may be connected to the output terminals t1b and t6b, the input terminal t3a to the output terminals t4b and t9b, the input terminal t5a to the output terminals t2b and t7b, the input terminal t7a to the output terminals t5b and t10b and the input terminal t9a to the output terminals t3b and t8b, respectively. In this alternative embodiment, a clock signal supplied to an output terminal tib (where $2 \leq i \leq 10$) has a phase shifted from that of a clock signal supplied to the previous output terminal t(i−1)b by a phase difference of 4 ns. Accordingly, the clock signals PH1 through PH10 to be output from the frequency divider circuit 200 will make a 10-phase clock having a phase difference of 4 ns.

Figure 8B:
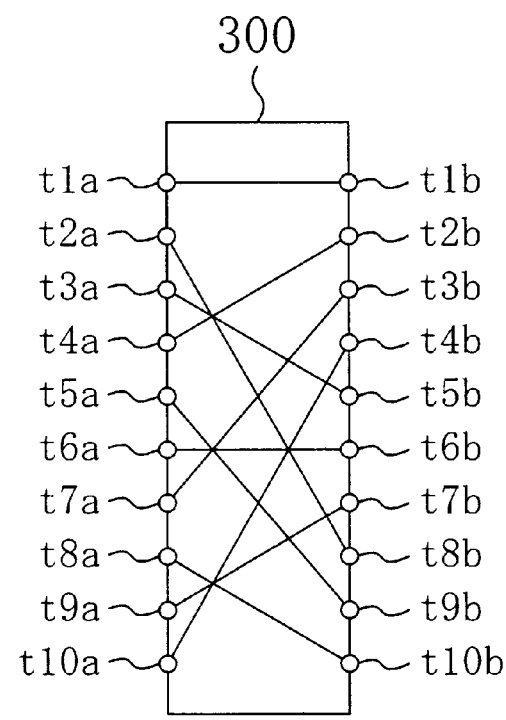

To obtain a 10-phase clock having a phase difference of 3 ns, the input terminals t1a through t10a and output terminals t1b through t10b of the selector circuit 300 may be connected together as shown in FIG. 8B. Specifically, the input terminals t1a, t2a, t3a, t4a, t5a, t6a, t7a, t8a, t9a and t10a may be connected to the output terminals t1b, t8b, t5b, t2b, t9b, t6b, t3b, t10b, t7b and t4b, respectively. In this alternative embodiment, a clock signal supplied to an output terminal tib (where $2 \leq i \leq 10$) has a phase shifted from that of a clock signal supplied to the previous output terminal t(i−1)b by a phase difference of 3 ns. Accordingly, the clock signals PH1 through PH10 to be output from the frequency divider circuit 200 will make a 10-phase clock having a phase difference of 3 ns.

Figure 9:
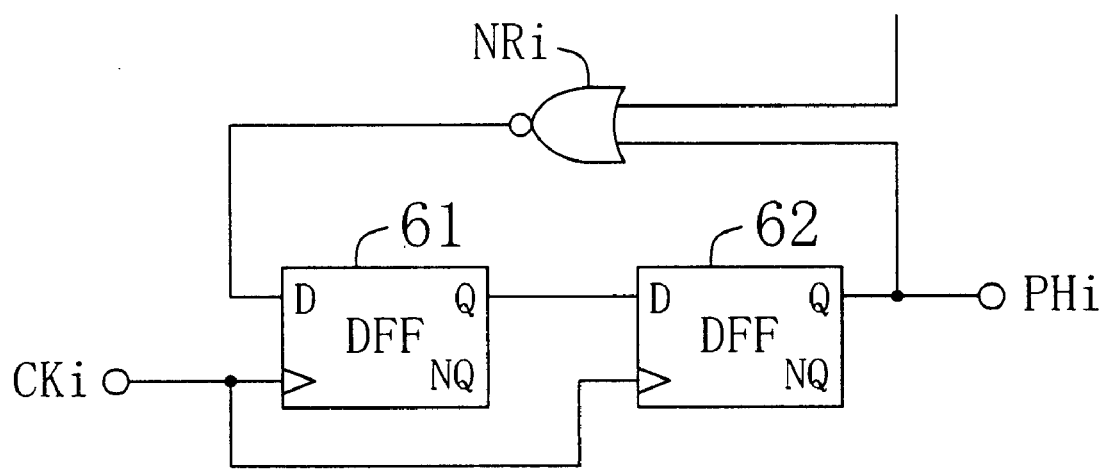
FIG. 9 is a block diagram illustrating how a frequency dividing unit may be configured to divide the frequency by four.

In the foregoing illustrative embodiment, each clock signal output from the PLL circuit 100 has its frequency divided by two by the frequency divider circuit 200. To divide the frequency of each clock signal by four, each frequency dividing unit may include a pair of D-flip-flops DFF61 and DFF62 that are connected in series to each other as shown in FIG. 9. As can be seen, by changing the number of D-flip-flop stages included in each frequency dividing unit in this manner, the frequency division ratio can be adjusted.

As described above, according to the first embodiment, a multiphase clock, consisting of clock signals PH1 through PH10 having a desired frequency and a desired phase difference, can be obtained without making any fine adjustment on the voltage-controlled oscillator VCO.

Accordingly, by preparing a plurality of frequency divider circuits with mutually different frequency division ratios, it is possible to cope with applications requiring discrete and wide-range frequencies as in an IEEE 1394.b-compliant serial data transmitter, for example. As a result, the advantages of a multiphase clock can be made full use of. That is to say, CMOS devices can be operated in parallel with their operating frequencies reduced, thus realizing a high-speed data transmitter LSI using the CMOS devices.

Embodiment 2

Figure 10:
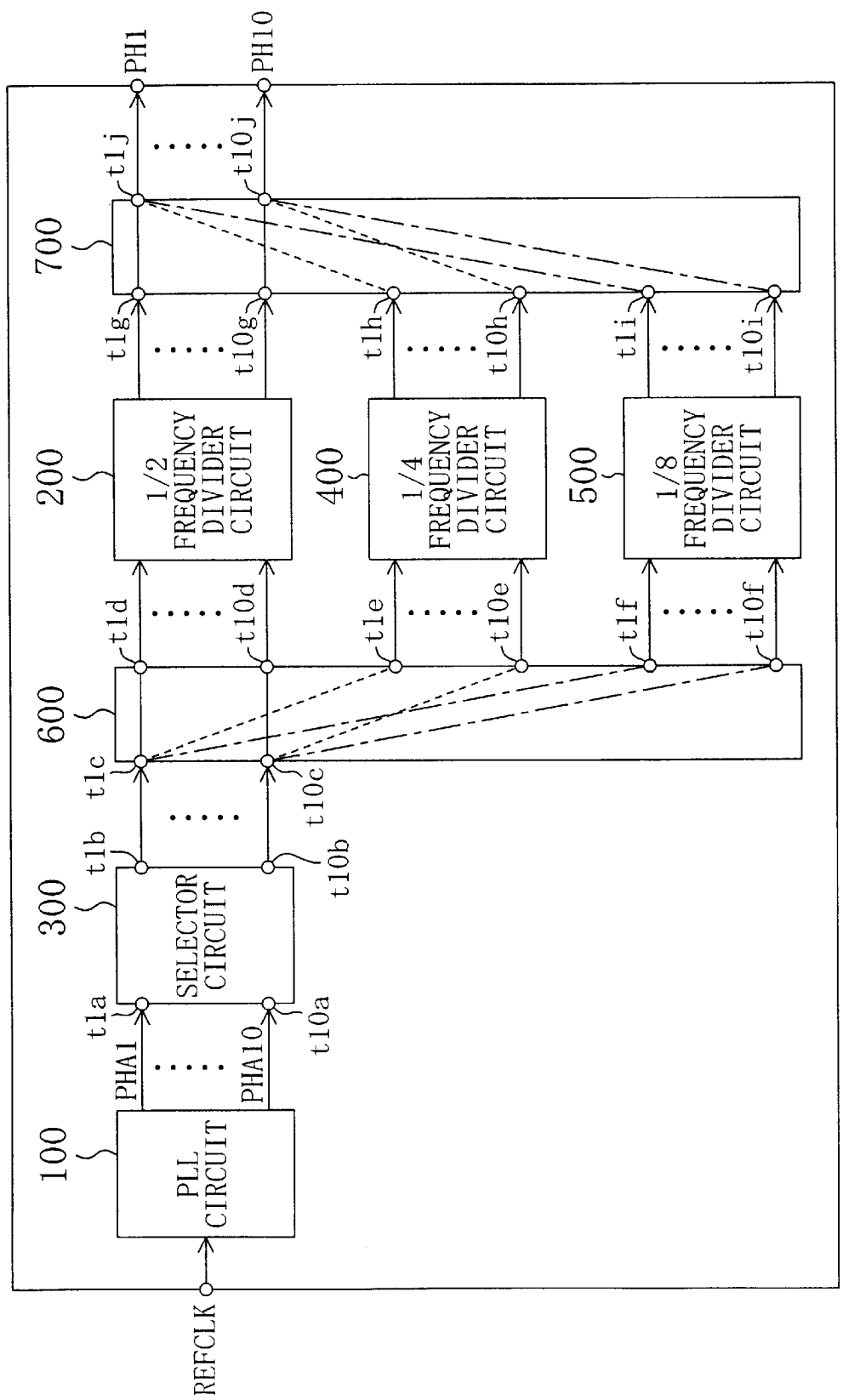
FIG. 10 is a block diagram illustrating an overall configuration for a multiphase clock generator according to a second embodiment of the present invention.

FIG. 10 is a block diagram illustrating an overall configuration for a multiphase clock generator according to a second embodiment of the present invention. As shown in FIG. 10, the clock generator further includes switching circuits 600 and 700 and two more frequency divider circuits 400 and 500 in addition to all the components of the multiphase clock generator 1 shown in FIG. 1.

The switching circuit 600 includes input terminals t1c through t10c and output terminals t1d through t10d, t1e through t10e and t1f through t10f. The clock signals, output through the output terminals t1b through t10b of the selector circuit 300, are received at the input terminals t1c through t10c, respectively. The switching circuit 600 selectively connects each of the input terminals t1c through t10c to one of the output terminals t1d through t10d, t1e through t10e and t1f through t10f.

The frequency divider circuit 200 is the same as the counterpart illustrated in FIG. 5. Specifically, the frequency divider circuit 200 divides the frequency of the clock signals, output from the switching circuit 600 through the output terminals t1d through t10d, by two and then outputs the frequency-divided signals.

The frequency divider circuit 400 is a modified version of the counterpart illustrated in FIG. 5. Specifically, in each frequency dividing unit of the frequency divider circuit 400, two stages of D-flip-flops are connected in series together, thereby dividing the frequency of the clock signals output from the switching circuit 600 through the output terminals t1e through t10e by four and then outputting the frequency-divided signals.

The frequency divider circuit 500 is another modified version of the counterpart illustrated in FIG. 5. Specifically, in each frequency dividing unit of the frequency divider circuit 500, three stages of D-flip-flops are connected in series together, thereby dividing the frequency of the clock signals output from the switching circuit 600 through the output terminals t1f through t10f by eight and then outputting the frequency-divided signals.

The switching circuit 700 includes three sets of input terminals t1g through t10g, t1h through t10h and t1i through t10i and output terminals t1j through t10j. The clock signals of the 10-phase clock output from the frequency divider circuit 200 are received at the input terminals t1g through t10g. The clock signals of the 10-phase clock output from the frequency divider circuit 400 are received at the input terminals t1h through t10h. The clock signals of the 10-phase clock output from the frequency divider circuit 500 are received at the input terminals t1i through t10i. The switching circuit 700 selectively connects each of the input terminals t1g through t10g, t1h through t10h and t1i through t10i to one of the output terminals t1j through t10j.

In the multiphase clock generator with such a configuration, the input and output terminals of the switching circuits 600 and 700 are selectively connected together depending on which 10-phase clock is needed. Specifically, if the 10-phase clock (with a phase difference of 2 ns and a frequency of 50 MHz) output from the frequency divider circuit 200 is needed, then the switching circuit 600 connects the input terminals t1c through t10c to the output terminals t1d through t10d, respectively, while the switching circuit 700 connects the input terminals t1g through t10g to the output terminals t1j through t10j, respectively, as indicated by the solid lines in FIG. 10. On the other hand, if the 10-phase clock (with a phase difference of 2 ns and a frequency of 25 MHz) output from the frequency divider circuit 400 is needed, then the switching circuit 600 connects the input terminals t1c through t10c to the output terminals t1e through t10e, respectively, and the switching circuit 700 connects the input terminals t1h through t10h to the output terminals t1j through t10j, respectively, as indicated by the dashed lines in FIG. 10. And if the 10-phase clock (with a phase difference of 2 ns and a frequency of 12.5 MHz) output from the frequency divider circuit 500 is needed, then the switching circuit 600 connects the input terminals t1c through t10c to the output terminals t1f through t10f, respectively, and the switching circuit 700 connects the input terminals t1i through t10i to the output terminals t1j through t10j, respectively, as indicated by the one-dot chains in FIG. 10.

As described above, the multiphase clock generator of the second embodiment includes the selector circuit 300, switching circuits 600 and 700 and frequency divider circuits 200, 400 and 500, and can obtain a multiphase clock having a desired frequency and desired phase difference. Accordingly, this multiphase clock generator can cope with applications requiring discrete and wide-range frequencies as in an IEEE 1394.b-compliant serial data transmitter, for example. As a result, the advantages of a multiphase clock can be made full use of. That is to say, CMOS devices can be operated in parallel with their operating frequencies reduced, thus realizing a high-speed data transmitter LSI using the CMOS devices.

Embodiment 3

Figure 11:
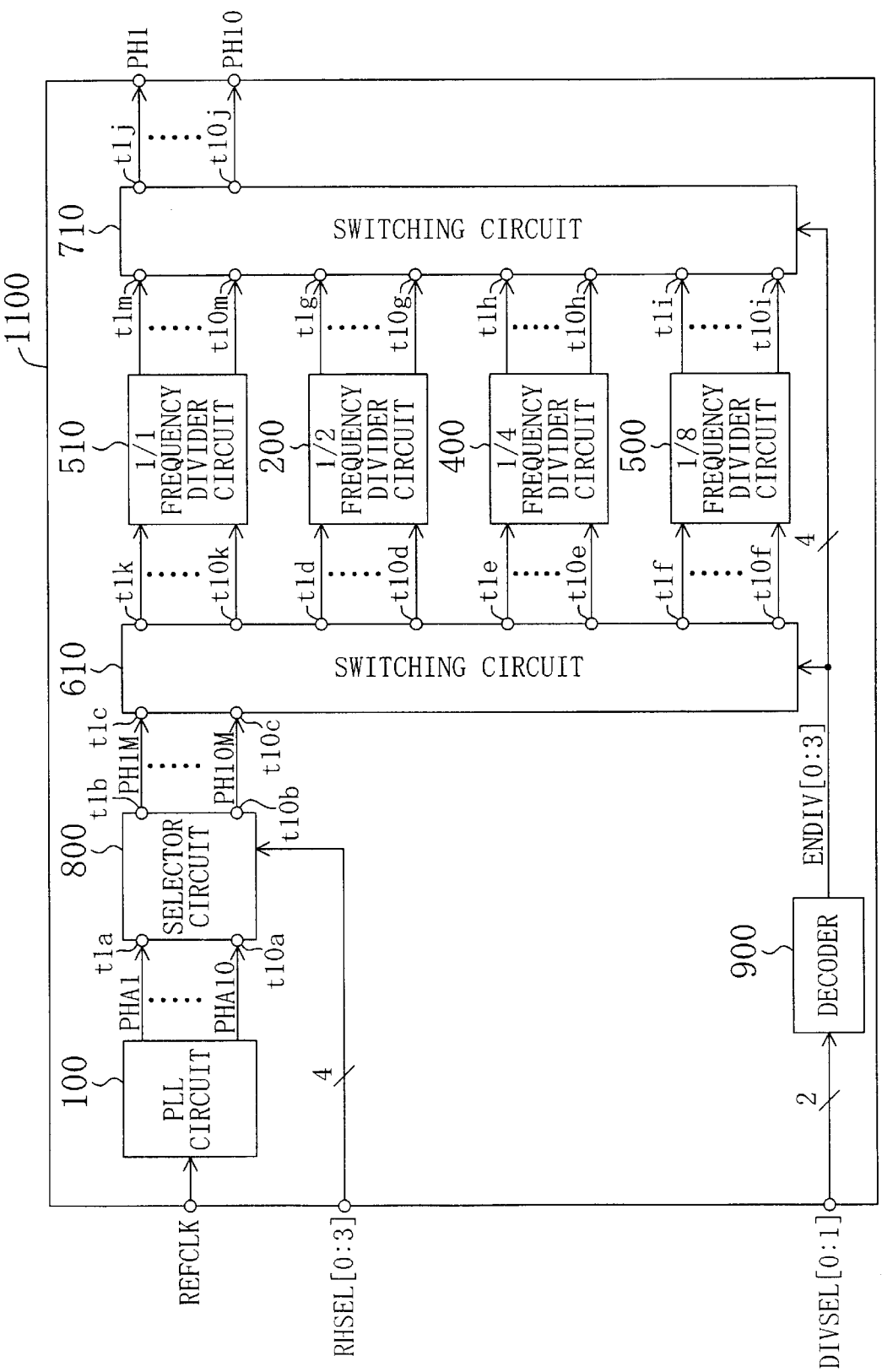
FIG. 11 is a block diagram illustrating an overall configuration for a multiphase clock generator according to a third embodiment of the present invention.

FIG. 11 is a block diagram illustrating an overall configuration for a multiphase clock generator according to a third embodiment of the present invention. As shown in FIG. 11, the multiphase clock generator 1100 includes PLL circuit 100, frequency divider circuits 200, 400, 500 and 510, switching circuits 610 and 710, selector circuit 800 and decoder 900.

The selector circuit 800 receives the clock signals PHA1 through PHA10 of the 10-phase clock at input terminals t1a through t10a, respectively, and then outputs at least one of those signals PHA1 through PHA10, which has a phase difference specified by a select signal PHSEL[0:3], as clock signals PH1M through PH10M through output terminals t1b through t10b, respectively. The select signal PHSEL[0:3] is a 4-bit signal externally input to specify a desired phase difference. In the illustrated embodiment, 1 ns, 2 ns , 4 ns or 8 ns may be specified as the phase difference. And when 1 ns, 2 ns , 4 ns or 8 ns is specified as the phase difference, 1000, 0100, 0010 or 0001 is respectively provided as the select signal PHSEL[0:3].

Responsive to a 2-bit select signal DIVSEL[0:1] externally input, the decoder 900 outputs a 4-bit select signal ENDIV[0:3]. The select signal DIVSEL[0:1] is a 2-bit signal externally input to specify a desired frequency division ratio. In the illustrated embodiment, 1/1, 1/2, 1/4 or 1/8 may be specified as the frequency division ratio. And when 1/1, 1/2, 1/4 or 1/8 is specified as the frequency division ratio, 00, 01, 10 or 11 is respectively provided as the select signal DIVSEL[0:1].

The switching circuit 610 includes input terminals t1c through t10c and four sets of output terminals t1d through t10d, t1e through t10e, t1f through t10f and t1k through t10k. The clock signals PH1M through PH10M output from the selector circuit 800 through the output terminals t1b through t10b are received at the input terminals t1c through t10c. Responsive to the 4-bit select signal ENDIV[0:3] supplied from the decoder 900, the switching circuit 610 selectively connects each of the input terminals t1c through t10c to one of the output terminals t1d through t10d, t1e through t10e, t1f through t10f and t1k through t10k.

The frequency divider circuit 510 divides the frequency of the clock signals, which have been output from the switching circuit 610 through the output terminals t1k through t10k, by one and then outputs the non-frequency-divided signals. That is to say, the frequency divider circuit 510 outputs clock signals, which have the same frequency as the clock signals output from the switching circuit 610 through the output terminals t1k through t10k, to the input terminals t1m through t10m of the switching circuit 710.

The switching circuit 710 includes four sets of input terminals t1g through t10g, t1h through t10h, t1i through t10i and t1m through t10m and output terminals t1j through t10j. The clock signals output from the frequency divider circuit 200 are received at the input terminals t1g through t10g. The clock signals output from the frequency divider circuit 400 are received at the input terminals t1h through t10h. The clock signals output from the frequency divider circuit 500 are received at the input terminals t1i through t10i. And the clock signals output from the frequency divider circuit 510 are received at the input terminals t1m through t10m. Responsive to the 4-bit select signal ENDIV[0:3] supplied from the decoder 900, the switching circuit 710 selectively connects one of the input terminals t1g through t10g, t1h through t10h, t1i through t10i and t1m through t10m to associated one of the output terminals t1j through t10j.

Figure 12:
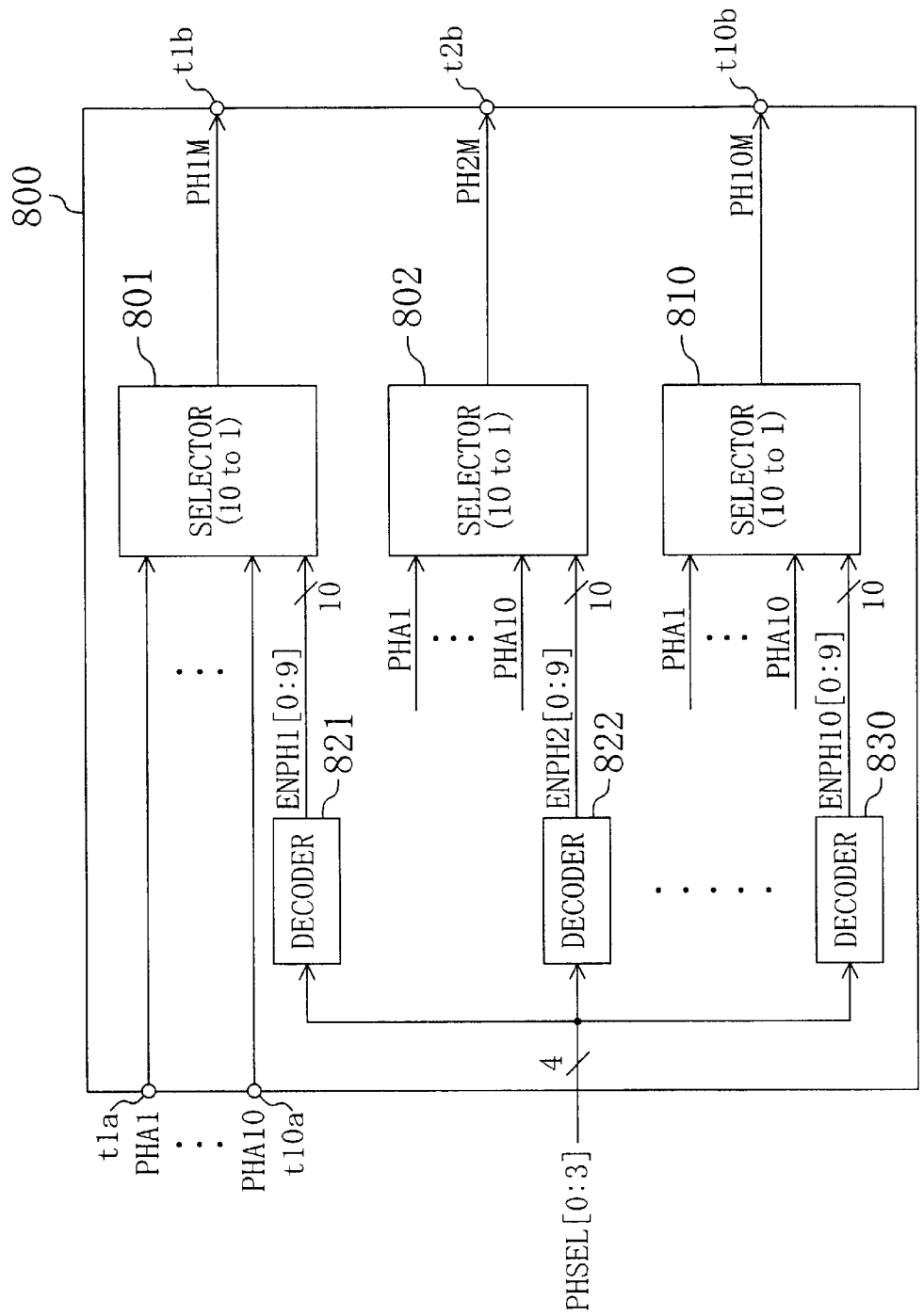
FIG. 12 is a block diagram illustrating an internal configuration for the selector circuit shown in FIG. 11.

FIG. 12 is a block diagram illustrating an internal configuration for the selector circuit 800 shown in FIG. 11. As shown in FIG. 12, the selector circuit 800 includes selectors 801 through 810 and decoders 821 through 830. Responsive to the 4-bit select signal PHSEL[0:3], the decoders 821 through 830 output 10-bit select signals ENPH1[0:9] through ENPH10[0:9]. Responsive to associated one of the select signals ENPH1[0:0] through ENPH10[0:0] output from the decoders 821 through 830, each of the selectors 801 through 810 outputs one of the clock signals PHA1 through PHA10 as the clock signal PH1M, PH2M, ..., or PH10M.

Specifically, responsive to a 4-bit select signal PHSEL[0:3] of (1000) specifying a phase difference of 1ns, the decoder 821 outputs a 10-bit select signal ENPH1[0:9] of (0000000001) as shown in FIG. 13. In the select signal ENPH1[0:9], an $n^{th}$ bit (where $1 \leq n \leq 10$) as counted from the least significant bit (LSB) thereof (i.e., an $n^{th}$ rightmost bit) is associated with a clock signal PHAn. For example, the LSB (i.e., the rightmost bit) of the select signal ENPH1[0:9] is associated with the clock signal PHA1 and the most significant bit (i.e., the leftmost bit) of the select signal ENPH1[0:9] is associated with the clock signal PHA10. Then, the selector 801 outputs the clock signal PHA1, corresponding to the only 1-bit of the select signal ENPH1[0:9] supplied from the decoder 821, as the clock signal PH1M. In this manner, responsive to the select signal PHSEL[0:3] specifying a desired phase difference, the decoder 821 outputs the select signal ENPH1[0:9] of which one of the 10 bits is 1-bit. In response, the selector 801 outputs a clock signal, corresponding to the only 1-bit of the select signal ENPH1[0:9] supplied from the decoder 821, as the clock signal PH1M.

Each of the other decoders 822 through 830 operates in the same way as the decoder 821 and each of the other selectors 802 through 810 operates in the same way as the selector 801. FIGS. 14 through 22 illustrate the relationships between the select signals ENPH2[0:9] through ENPH10[0:9] output from the decoders 822 through 830 and the clock signals PH2M through PH10M output from the selectors 802 through 810, respectively.

As shown in FIG. 23, if 1 ns has been specified as the phase difference, the selector circuit 800 with such a configuration outputs the clock signals (PHA1, PHA2, PHA3, PHA4, PHA5, PHA6, PHA7, PHA8, PHA9, PHA10) as the respective clock signals PH1M through PH10M of the 10-phase clock. If 2 ns has been specified as the phase difference, the selector circuit 800 outputs the clock signals (PHA1, PHA3, PHA5, PHA7, PHA9, PHA1, PHA3, PHA5, PHA7, PHA9) as the respective clock signals PH1M through PH10M of the 10-phase clock. If 4 ns has been specified as the phase difference, the selector circuit 800 outputs the clock signals (PHA1, PHA5, PHA9, PHA3, PHA7, PHA1, PHA5, PHA9, PHA3, PHA7) as the respective clock signals PH1M through PH10M of the 10-phase clock. And if 8 ns has been specified as the phase difference, the selector circuit 800 outputs the clock signals (PHA1, PHA9, PHA7, PHA5, PHA3, PHA1, PHA9, PHA7, PHA5, PHA3) as the respective clock signals PH1M through PH10M of the 10-phase clock.

Figures 24, 25:
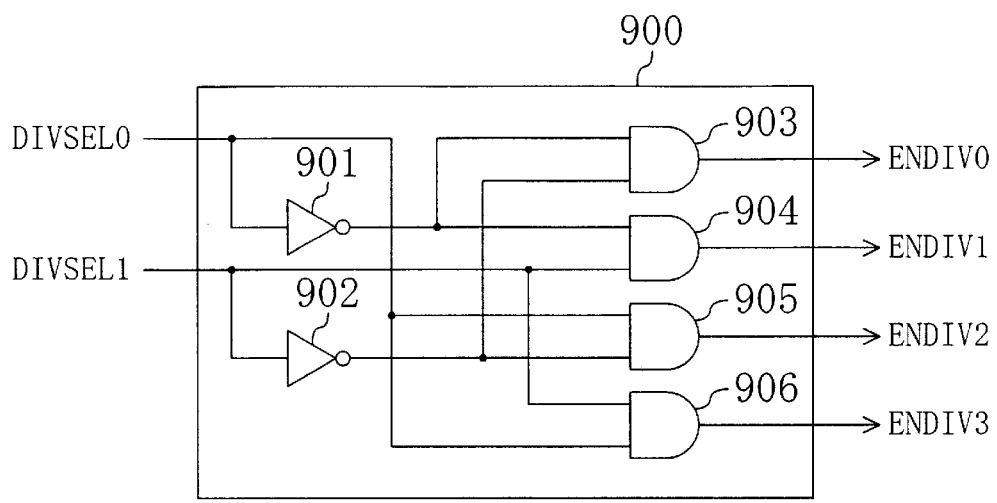
FIG. 24 is a block diagram illustrating an internal configuration for the decoder shown in FIG. 11.
FIG. 25 illustrates relationships between the select signals supplied to the decoder shown in FIG. 24 and the select signals output from the decoder.

FIG. 24 is a block diagram illustrating an internal configuration for the decoder 900 shown in FIG. 11. As shown in FIG. 24, the decoder 900 includes inverters 901 and 902 and AND gates 903, 904, 905 and 906. The inverters 901 and 902 invert select signals DIVSEL0 and DIVSEL1, respectively. The AND gate 903 outputs a logical product of the outputs of the inverters 901 and 902. The output of the AND gate 903 will be a select signal ENDIV0. The AND gate 904 outputs a logical product of the output of the inverter 901 and the select signal DIVSEL1. The output of the AND gate 904 will be a select signal ENDIV1. The AND gate 905 outputs a logical product of the select signal DIVSEL0 and the output of the inverter 902. The output of the AND gate 905 will be a select signal ENDIV2. And the AND gate 906 outputs a logical product of the select signals DIVSEL0 and DIVSEL1. The output of the AND gate 906 will be a select signal ENDIV3.

Hereinafter, it will be described with reference to FIG. 25 how the decoder 900 with such a configuration operates. If 1/1 has been specified as the frequency division ratio, a 2-bit select signal DIVSEL[0:1] (DIVSEL0=0, DIVSEL1=0) is supplied to the decoder 900. In response, the decoder 900 outputs a 4-bit select signal ENDIV[0:3] (ENDIV0=1, ENDIV1=0, ENDIV2=0, ENDIV3=0). If 1/2 has been specified as the frequency division ratio, a 2-bit select signal DIVSEL[0:1] (DIVSEL0=0, DIVSEL1=1) is supplied to the decoder 900. In response, the decoder 900 outputs a 4-bit select signal ENDIV[0:3] (ENDIV0=0, ENDIV1=1, ENDIV2=0, ENDIV3=0). If 1/4 has been specified as the frequency division ratio, a 2-bit select signal DIVSEL[0:1] (DIVSEL0=1, DIVSEL1=0) is supplied to the decoder 900. In response, the decoder 900 outputs a 4-bit select signal ENDIV[0:3] (ENDIV0=0, ENDIV1=0, ENDIV2=1, ENDIV3=0). And if 1/8 has been specified as the frequency division ratio, a 2-bit select signal DIVSEL[0:1] (DIVSEL0=1, DIVSEL1=1) is supplied to the decoder 900. In response, the decoder 900 outputs a 4-bit select signal ENDIV[0:3] (ENDIV0=0, ENDIV1=0, ENDIV2=0, ENDIV3=1).

Next, it will be described with reference to FIG. 11 how the switching circuits 610 and 710 operate responsive to the select signal ENDIV[0:3] supplied from the decoder 900. In response to a select signal ENDIV[0:3] (ENDIV0=1, ENDIV1=0, ENDIV2=0, ENDIV3=0) supplied from the decoder 900, the switching circuit 610 connects the input terminals t1c through t10c to the output terminals t1k through t10k and the switching circuit 710 connects the input terminals t1m through t10m to the output terminals t1j through t10j. In response to another select signal ENDIV[0:3] (ENDIV0=0, ENDIV1=1, ENDIV2=0, ENDIV3=0)

supplied from the decoder 900, the switching circuit 610 connects the input terminals t1c through t10c to the output terminals t1d through t10d and the switching circuit 710 connects the input terminals t1g through t10g to the output terminals t1j through t10j. In response to still another select signal ENDIV[0:3] (ENDIV0=0, ENDIV1=0, ENDIV2=1, ENDIV3=0) supplied from the decoder 900, the switching circuit 610 connects the input terminals t1c through t10c to the output terminals t1e through t10e and the switching circuit 710 connects the input terminals t1h through t10h to the output terminals t1j through t10j. And in response to yet another select signal ENDIV[0:3] (ENDIV0=0, ENDIV1=0, ENDIV2=0, ENDIV3=1) supplied from the decoder 900, the switching circuit 610 connects the input terminals t1c through t10c to the output terminals t1f through t10f and the switching circuit 710 connects the input terminals t1i through t10i to the output terminals t1j through t10j.

Next, it will be described with reference to FIG. 11 how the multiphase clock generator 1100 with such a configuration operates.

By choosing one of the four types of select signals PHSEL[0:3] and one of the four types of select signals DIVSEL[0:1] in an arbitrary combination, this multiphase clock generator 1100 can obtain a 10-phase clock consisting of ten clock signals PH1 through PH10 having a desired phase difference of 1, 2, 4 or 8 ns and a desired frequency of 100, 50, 25 or 12.5 MHz. For example, if a 10-phase clock consisting of ten clock signals PH1 through PH10 having a phase difference of 2 ns and a frequency of 50 MHz is needed, a select signal PHSEL[0:3] of (0100) and a select signal DIVSEL[0:1] of (DIVSEL0=0, DIVSEL1=1) are supplied. Then, responsive to the select signal PHSEL[0:3] (0100), the selector circuit 800 outputs a 10-phase clock consisting of the clock signal PH1M through PH10M (PHA1, PHA3, PHA5, PHA7, PHA9, PHA1, PHA3, PHA5, PHA7, PHA9) having a phase difference of 2 ns. On the other hand, responsive to the select signal DIVSEL[0:1] (DIVSEL0=0, DIVSEL1=1), the decoder 900 outputs a select signal ENDIV[0:3] (ENDIV0=0, ENDIV1=1, ENDIV2=0, ENDIV3=0). And in response to the select signal ENDIV[0:3] (ENDIV0=0, ENDIV1=1, ENDIV2=0, ENDIV3=0) supplied from the decoder 900, the switching circuit 610 connects the input terminals t1c through t10c to the output terminals t1d through t10d, while the switching circuit 710 connects the input terminals t1g through t10g to the output terminals t1j through t10j. As a result, the clock signals PH1M through PH10M in ten phases, output from the selector circuit 800, have their frequency divided by two by the frequency divider circuit 200 and are output as clock signals PH1 through PH10 having a phase difference of 2 ns and a frequency of 50 MHz.

As described above, the multiphase clock generator of the third embodiment can obtain a multiphase clock having a desired frequency and a desired phase difference by using the selector circuit 800, switching circuits 610 and 710, frequency divider circuits 200, 400, 500 and 510 and decoder 900.

Embodiment 4

Figure 26:
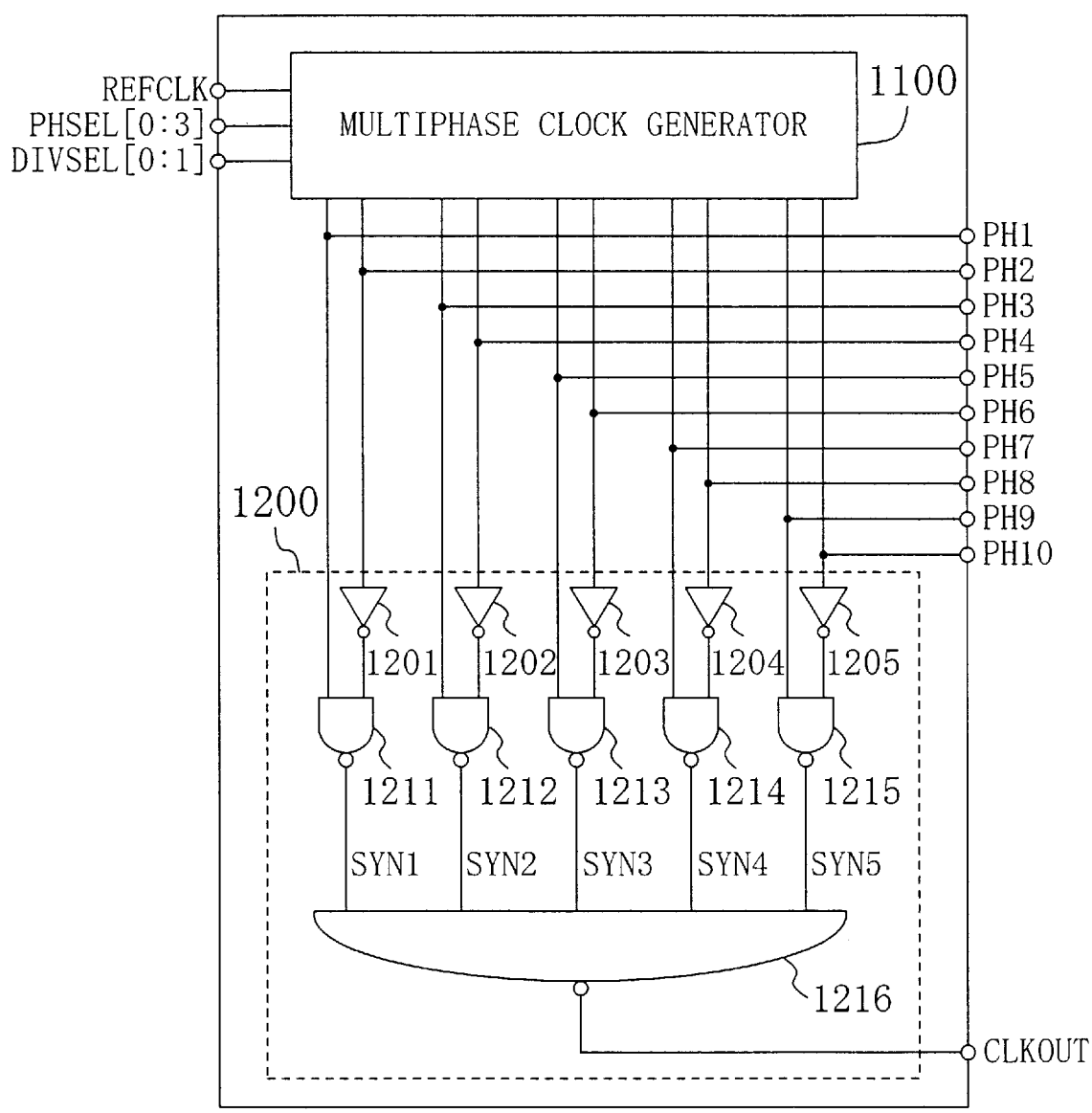
FIG. 26 is a block diagram illustrating an overall configuration for a multiphase clock generator circuit according to a fourth embodiment of the present invention.

FIG. 26 is a block diagram illustrating an overall configuration for a multiphase clock generator circuit according to a fourth embodiment of the present invention. As shown in FIG. 26, the multiphase clock generator circuit includes a clock synthesizer 1200 in addition to the multiphase clock generator 1100 show n in FIG. 11. The clock synthesizer 1200 includes inverters 1201 through 1205 and NAND gates 1211 through 1216. The inverters 1201 through 1205 invert the clock signals PH2, PH4, PH6, PH8 and PH10 output from the multiphase clock generator 1100. The NAND gates 1211 through 1215 output respective negated logical products of the clock signals PH1, PH3, PH5, PH7 and PH9 output from the multiphase clock generator 1100 and the outputs of the inverters 1201 through 1205. The NAND gate 1216 outputs a negated logical product of the outputs SYN1 through SYN5 of the NAND gates 1211 through 1215. The output of the NAND gate 1216 is output as a serial clock signal CLKOUT.

Figure 27:
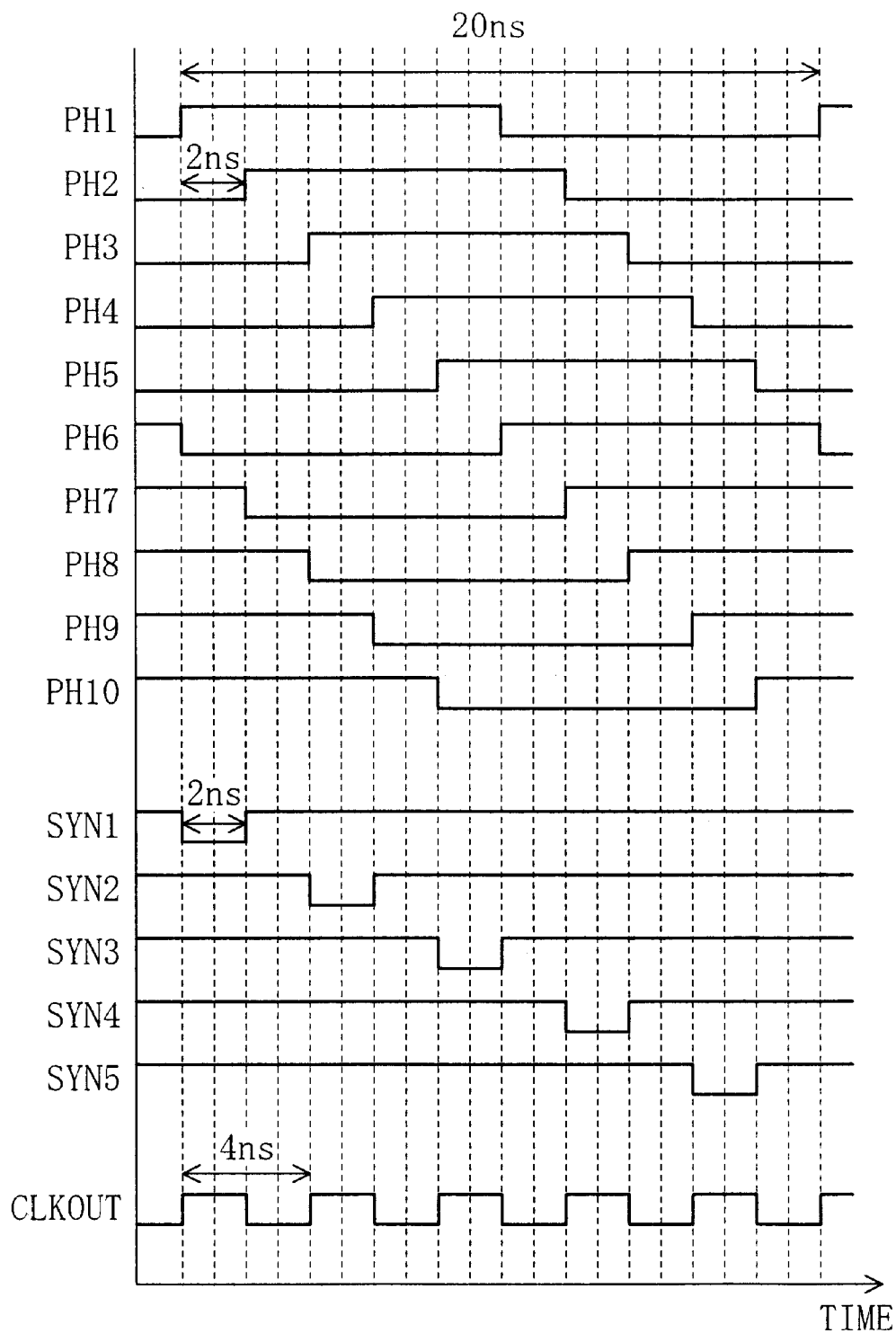
FIG. 27 is a timing diagram illustrating how the multiphase clock generator circuit shown in FIG. 26 operates.

Hereinafter, it will be described with reference to FIGS. 26 through 27 how the multiphase clock generator circuit with such a configuration operates.

Suppose a phase difference of 2 ns and a frequency division ratio of 1/2 have been specified by the select signals PHSEL[0:3] and DIVSEL[0:1]. In that case, clock signals PH1 through PH10 in ten phases having a frequency of 50 MHz and a phase difference of 2 ns are output from the multiphase clock generator 1100. In the clock synthesizer 1200, the NAND gates 1211 through 1215 output pulse signals SYN1 through SYN5 having a pulse width of 2 ns and a period of 20 ns as shown in FIG. 27. As a result, the NAND gate 1216 outputs a serial clock signal CLKOUT with a frequency of 250 MHz.

In the illustrative embodiment, a phase difference of 2 ns and a frequency division ratio of 1/2 are supposed to be specified. However, if a phase difference of 1 ns and a frequency division ratio of 1/1 have been specified, then the clock synthesizer 1200 outputs a serial clock signal CLKOUT with a frequency of 500 MHz. If a phase difference of 4 ns and a frequency division ratio of 1/4 have been specified, then the clock synthesizer 1200 outputs a serial clock signal CLKOUT with a frequency of 125 MHz. And if a phase difference of 8 ns and a frequency division ratio of 1/8 have been specified, then the clock synthesizer 1200 outputs a serial clock signal CLKOUT with a frequency of 62.5 MHz.

As described above, the multiphase clock generator circuit of the fourth embodiment can obtain clock signals PH1 through PH10 in multiple phases and a serial clock signal CLKOUT by specifying a predetermined phase difference and a predetermined frequency division ratio. Accordingly, where a block for performing parallel processing using a multiphase clock and a block for performing serial processing using a serial clock signal coexist on the same LSI chip, the multiphase clock generator circuit can supply both the multiphase clock and serial clock signal. Normally, a circuit for generating a serial clock signal should be provided separately in such a case, and the serial clock generator separately provided needs an internal PLL. In contrast, the clock synthesizer 1200 of the fourth embodiment needs no PLL. As a result, the chip area occupied can be saved and the cost can be cut down eventually.

Also, the serial clock signal CLKOUT is produced from the clock signals PH1 through PH10 in multiple phases. Accordingly, by checking the waveform of the serial clock signal CLKOUT, it is possible to see that the clock signals PH1 through PH10 in multiple phases are output normally.

Furthermore, according to this embodiment, the VCO in the multiphase clock generator 1100 can always operate at a constant frequency. Thus, the VCO can be designed much more easily and the turnaround time (TAT) can be shortened.

Embodiment 5

Figure 28:
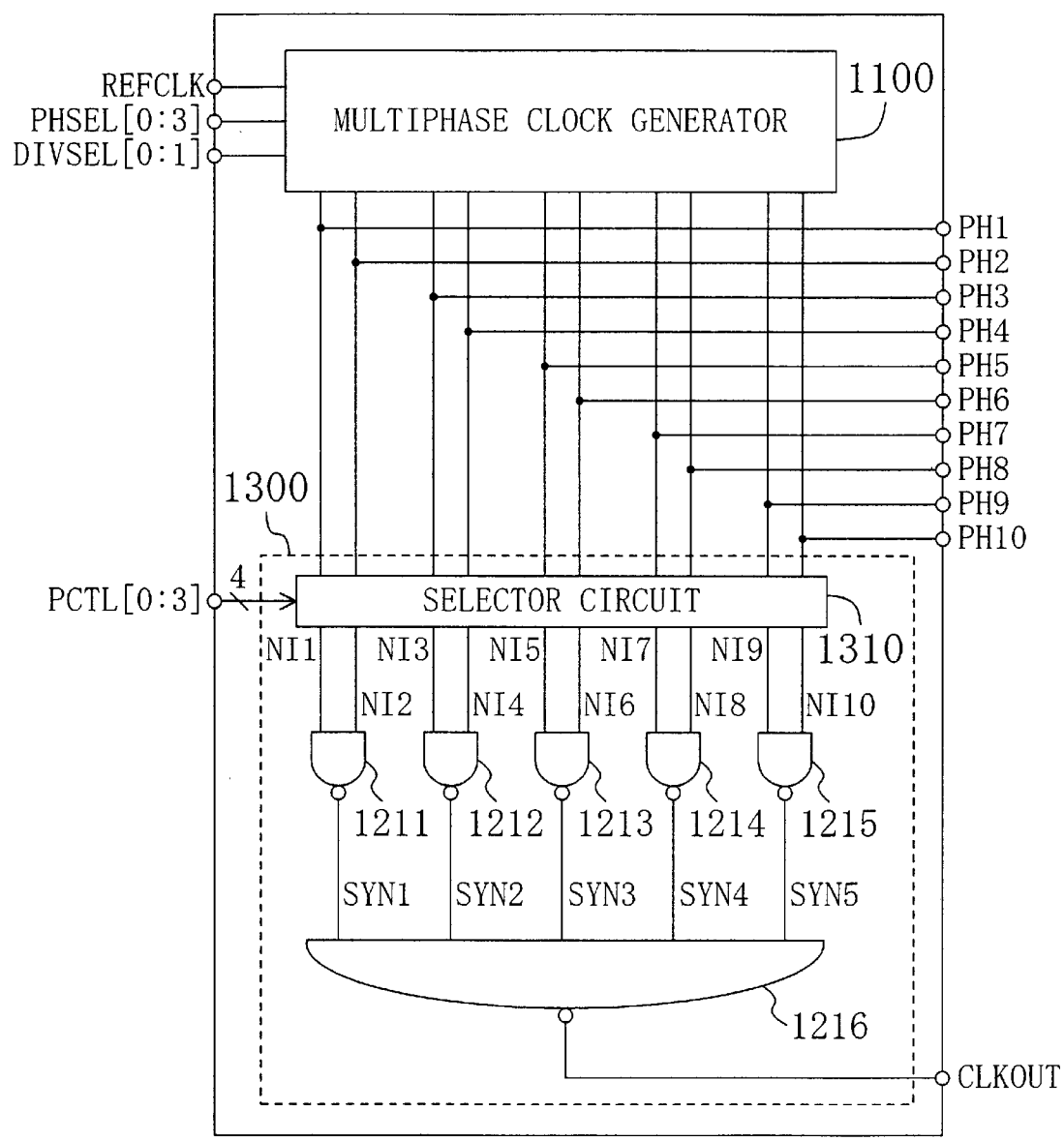
FIG. 28 is a block diagram illustrating an overall configuration for a multiphase clock generator circuit according to a fifth embodiment of the present invention.

FIG. 28 is a block diagram illustrating an overall configuration for a multiphase clock generator circuit according to a fifth embodiment of the present invention. As shown in FIG. 28, the multiphase clock generator circuit includes a clock synthesizing section 1300 in addition to the multiphase clock generator 1100 shown in FIG. 11. The clock synthesizing section 1300 includes a selector circuit 1310 and NAND gates 1211 through 1216. Responsive to a select signal PCTL[0:3] externally input, the selector circuit 1310 outputs the clock signals PH1, PH3, PH5, PH7 and PH9, supplied from the multiphase clock generator 1100, as signals NI1, NI3, NI5, NI7 and NI9, respectively. And the selector circuit 1310 also outputs clock signals, which are complementary to the remaining clock signals PH2, PH4, PH6, PH8 and PH10, as signals NI2, NI4, NI6, NI8 and NI10, respectively. The NAND gate 1211 outputs a negated logical product of the outputs NI1 and NI2 of the selector circuit 1310. The NAND gate 1212 outputs a negated logical product of the outputs NI3 and NI4 of the selector circuit 1310. The NAND gate 1213 outputs a negated logical product of the outputs NI5 and NI6 of the selector circuit 1310. The NAND gate 1214 outputs a negated logical product of the outputs NI7 and NI8 of the selector circuit 1310. The NAND gate 1215 outputs a negated logical product of the outputs NI9 and NI10 of the selector circuit 1310. And the NAND gate 1216 outputs a negated logical product of the outputs SYN1 through SYN5 of the NAND gates 1211 through 1215. The output of the NAND gate 1216 is output as a serial clock signal CLKOUT.

Figure 29:
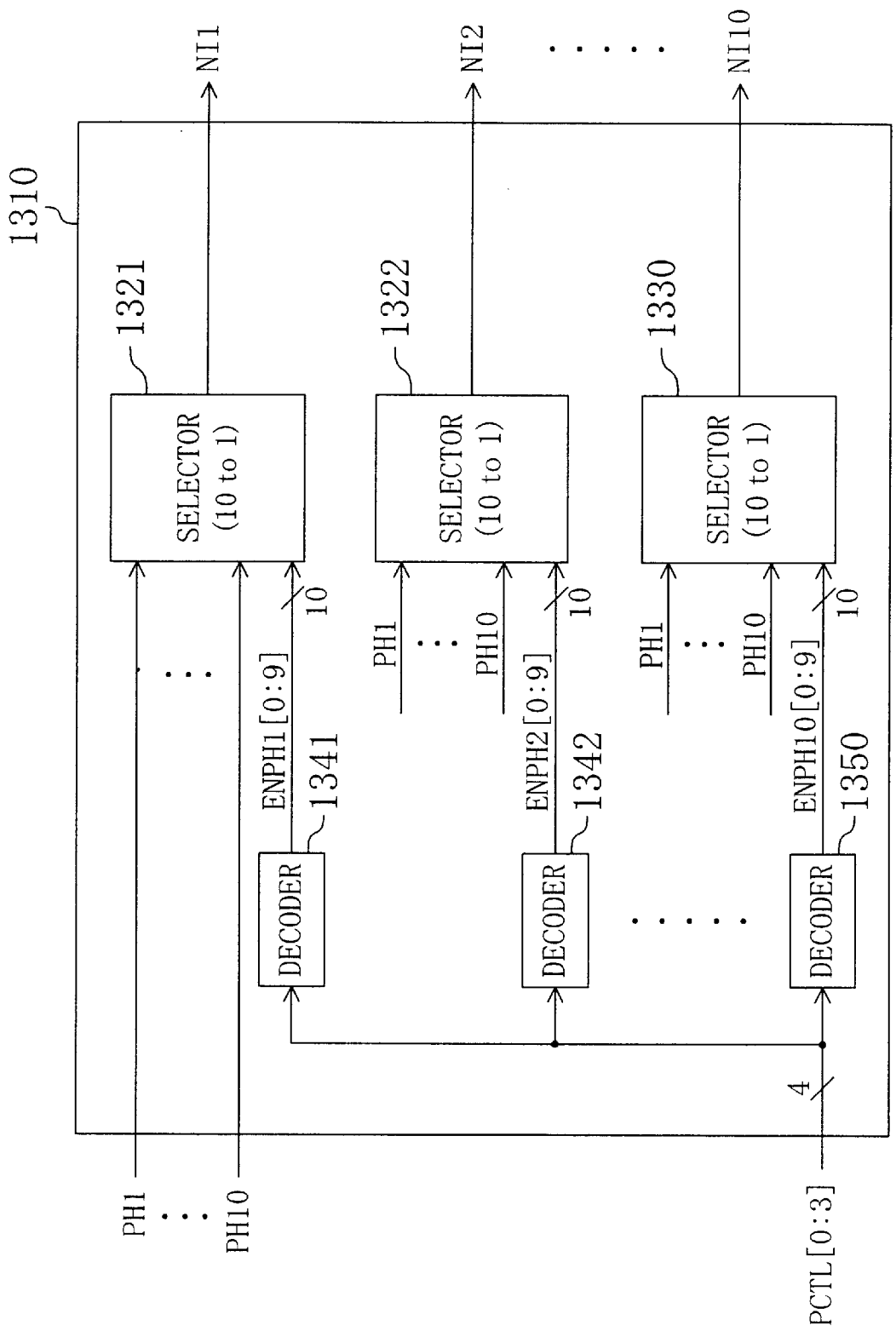
FIG. 29 is a block diagram illustrating an internal configuration for the selector circuit shown in FIG. 28.
Figure 31:
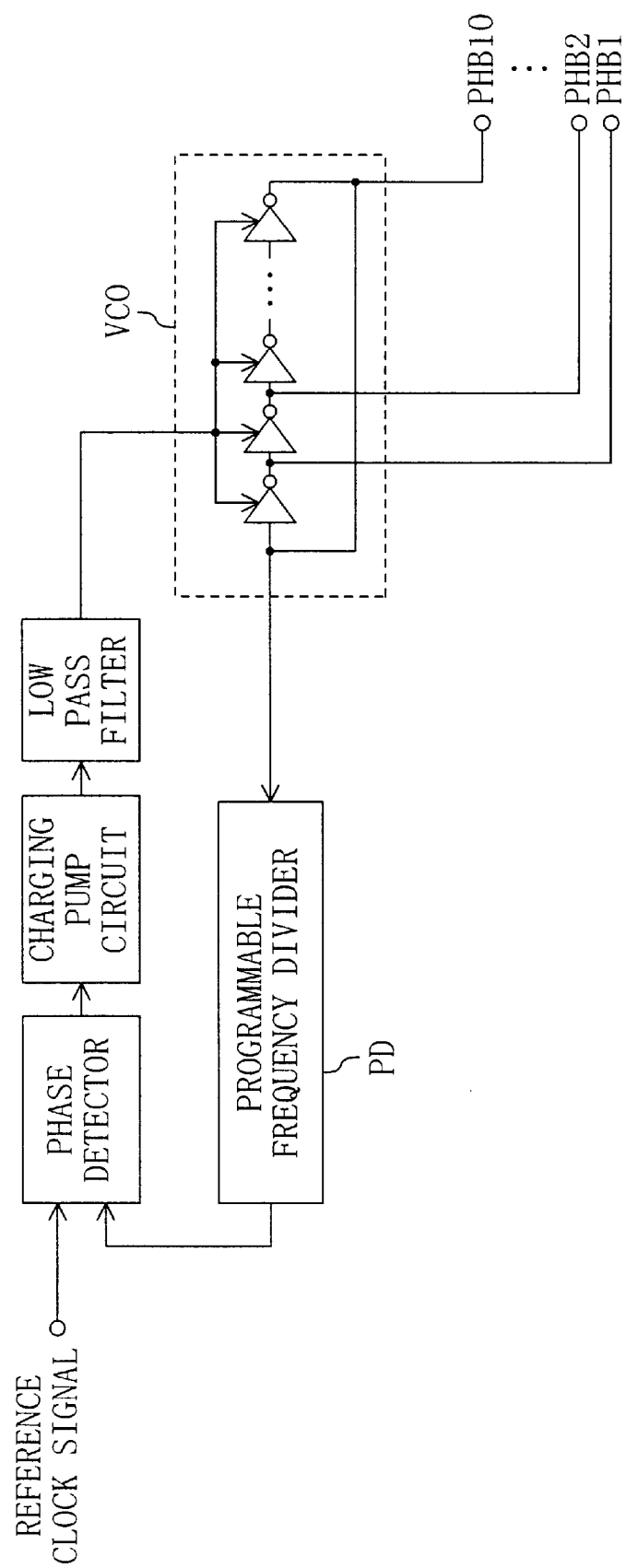
FIG. 31 is a block diagram illustrating a configuration for a known multiphase clock generator.
Figure 32:
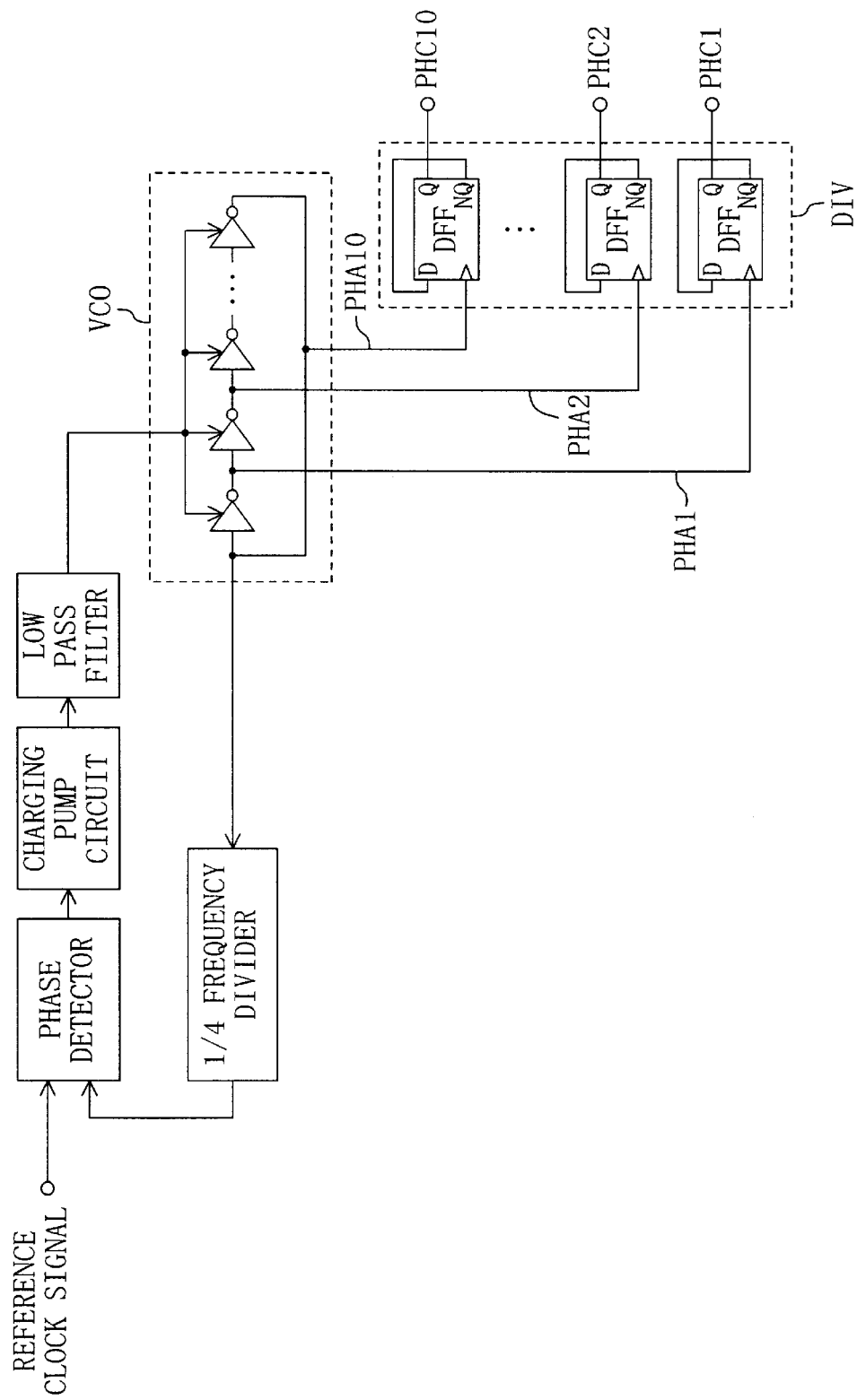
FIG. 32 is a block diagram illustrating a configuration for another known multiphase clock generator.
Figure 33:
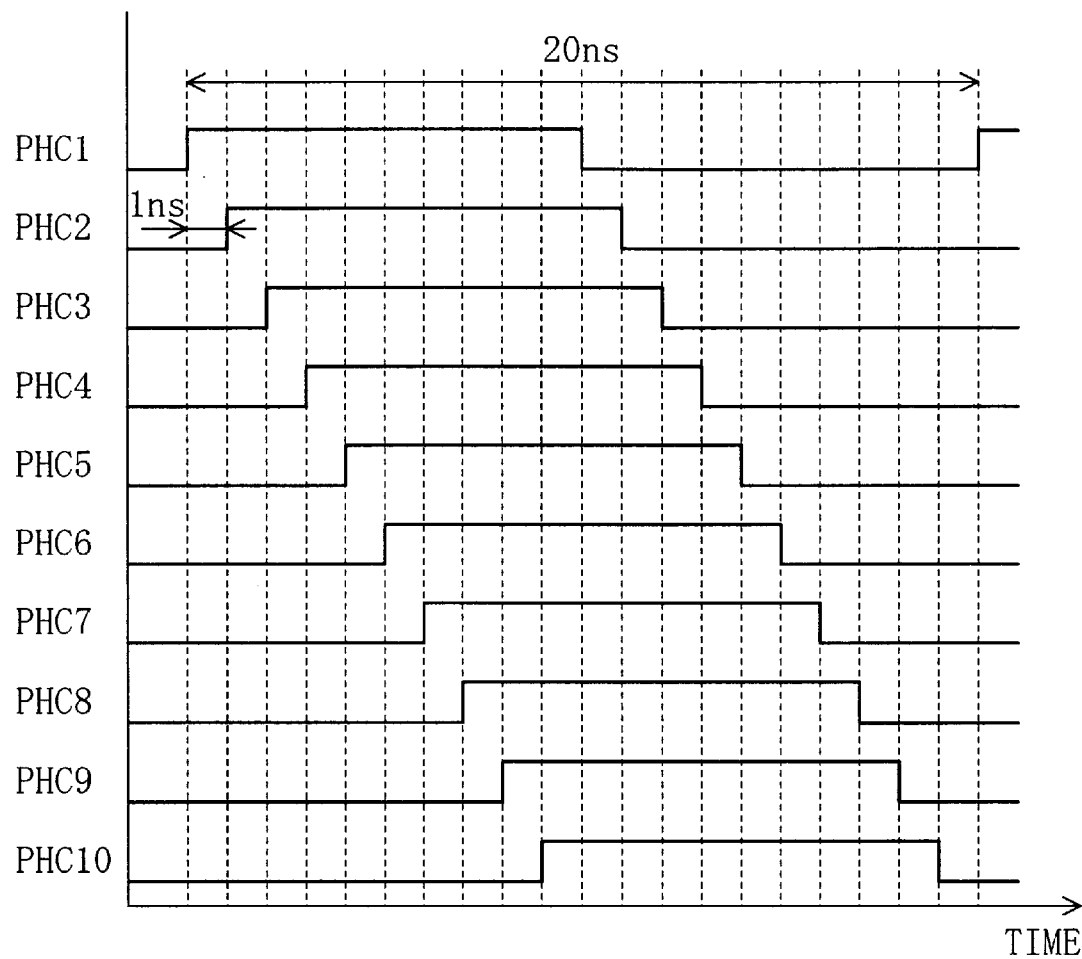
FIG. 33 is a timing diagram illustrating how the multiphase clock generator shown in FIG. 32 operates.

FIG. 29 is a block diagram illustrating an internal configuration for the selector circuit 1310 shown in FIG. 28. As shown in FIG. 29, the selector circuit 1310 includes selectors 1321 through 1330 and decoders 1341 through 1350. Responsive to the externally input select signal PCTL[0:3], the decoders 1341 through 1350 output 10-bit select signals ENPH1[0:9] through ENPH10[0:9] shown in FIG. 30. In the select signals ENPH1[0:9] through ENPH10[0:9], an $n^{th}$ bit (where $1 \leq n \leq 10$) as counted from the LSB thereof (i.e., an $n^{th}$ rightmost bit) is associated with a clock signal PHn. For example, the LSB (i.e., the rightmost bit) of the select signal is associated with the clock signal PH1 and the MSB (i.e., the leftmost bit) of the select signal is associated with the clock signal PH10. Then, each of the selectors 1321 through 1330 outputs one of the clock signals PH1, PH7, PH3, PH9, PH5, PH1, PH7, PH3, PH9 and PH5, corresponding to the only 1-bit of the select signal ENPH1[0:9], ENPH2[0:9], . . . , or ENPH10[0:9] supplied from the associated decoder 1341, 1342, . . . , or 1350, as the signal NI1, NI2, . . . , or NI10.

Next, it will be described how the multiphase clock generator circuit shown in FIG. 28 operates. Suppose a phase difference of 2 ns and a frequency division ratio of 1/2 have been specified by the select signals PHSEL[0:3] and DIVSEL[0:1], respectively.

In that case, clock signals PH1 through PH10 in ten phases, having a frequency of 50 MHz and a phase difference of 2 ns, are output from the multiphase clock generator 1100. Then, the selector circuit 1310 outputs the clock signals PH1, PH7, PH3, PH9, PH5, PH1, PH7, PH3, PH9 and PH5, supplied from the multiphase clock generator 1100, as signals NI1 through NI10, respectively. As shown in FIG. 27, the clock signals PH7, PH9, PH1, PH3 and PH5 are complementary to the clock signals PH2, PH4, PH6, PH8 and PH10, respectively. Accordingly, the NAND gates 1211 through 1215 respectively output the signals SYN1 through SYN5 shown in FIG. 27. As a result, the NAND gate 1216 outputs a serial clock signal CLKOUT with a frequency of 250 MHz.

In the clock synthesizer 1200 shown in FIG. 26, the clock signals PH2, PH4, PH6, PH8 and PH10 are inverted by the inverters 1201 through 1205 and then input to the NAND gates 1211 through 1215, respectively. That is to say, in each of the NAND gates 1211 through 1215, one input terminal receives the associated clock signal PH2, PH4, PH6, PH8 or PH10 after the clock signal has been inverted by the inverter 1201, 1202, 1203, 1204 or 1205, while the other input terminal receives the associated clock signal PH1, PH3, PH5, PH7 or PH9 directly. Accordingly, load capacitance associated with the path of the clock signal PH2, PH4, PH6, PH8 or PH10 received at one input terminal of the NAND gate 1211, 1212, 1213, 1214 or 1215 is different from that associated with the path of the clock signal PH1, PH3, PH5, PH7 or PH9 received at the other input terminal of the NAND gate 1211, 1212, 1213, 1214 or 1215. As a result, each pair of clock signals PH1 and PH2, PH3 and PH4, PH5 and PH6, PH7 and PH8, or PH9 and PH10 arrives at the associated NAND gate 1211, 1212, 1213, 1214 or 1215 after mutually different delays. Then, the duty of the serial clock signal CLKOUT cannot be 50—50.

In contrast, in the clock synthesizing section 1300 shown in FIG. 28, load capacitance associated with the path of the clock signal NI2, NI4, NI6, NI8 or NI10 received at one input terminal of the NAND gate 1211, 1212, 1213, 1214 or 1215 is equal to that associated with the path of the clock signal NI1, NI3, NI5, NI7 or NI9 received at the other input terminal of the NAND gate 1211, 1212, 1213, 1214 or 1215. This is because both sets of signals (NI2, NI4, NI6, NI8, NI10) and (NI1, NI3, NI5, NI7, NI9) are input to the NAND gates 1211 through 1215 by way of the selectors 1321 through 1330 as shown in FIG. 29. Accordingly, the difference in delay between these two sets of clock signals (NI2, NI4, NI6, NI8, NI10) and (NI1, NI3, NI5, NI7, NI9) input to the NAND gates 1211 through 1215 can be eliminated. As a result, a serial clock signal CLKOUT with a desired 50—50 duty can be obtained.

In the illustrative embodiment, the phase difference and frequency division ratio are supposed to be 2 ns and 1/2, respectively. However, this embodiment is equally applicable to any other combination of phase difference and frequency division ratio if there are clock signals complementary to the clock signals PH2, PH4, PH6, PH8 and PH10.

What is claimed is:

1. A multiphase clock generator comprising:

an oscillator for generating a first multiphase clock having a predetermined frequency and including a number of clock signals, the phase of each said clock signal included in the first multiphase clock being shifted from that of the previous one of the clock signals in the first multiphase clock by a first phase difference;

first selecting means, which receives the first multiphase clock from the oscillator and outputs a second multiphase clock including the same or a different number of clock signals, the phase of each said clock signal included in the second multiphase clock being shifted from that of the previous one of the clock signals in the second multiphase clock by a second phase difference, the second phase difference being n times as long as the first phase difference, where n is a predetermined positive integer; and frequency dividing means, which receives the second multiphase clock from the first select ing means, divides the frequency of the second multiphase clock and then outputs a group of clock signals with the divided frequency as a third multiphase clock.

2. The clock generator of claim 1, wherein the frequency dividing means comprises a plurality of frequency dividing units, a first one of the units being associated with a first one of the clock signals included in the second multiphase clock that has been received from the first selecting means, and wherein the first unit divides the frequency of the first clock signal after a second one of the units, which is associated with a second one of the clock signals that has a phase lead over the first clock signal by the second phase difference, has started to divide the frequency of the second clock signal.

3. The clock generator of claim 2, wherein each said frequency dividing unit comprises:

a single- or multi-stage flip-flop including a clock terminal, at which an associated one of the clock signals is received; and inverting means, which inverts an output at a last stage of the flip-flop and then supplies the inverted output to an input terminal at an initial stage of the flip-flop, and wherein the inverting means of the first unit is activated when an output at a last stage of a flip-flop, included in the second unit associated with the second clock signal, changes, the second clock signal having the phase lead over the first clock signal, associated with the first unit, by the second phase difference.

4. The clock generator of claim 1, wherein the first selecting means changes the integer n responsive to an external signal.

5. The clock generator of claim 1, wherein the frequency dividing means divides the frequency of the second multiphase clock, received from the first selecting means, at a ratio corresponding to an external signal.

6. The clock generator of claim 1, further comprising clock synthesizing means for generating a serial clock signal from the third multiphase clock that has been received from the frequency dividing means.

7. The clock generator of claim 6, wherein the clock synthesizing means comprises:

a first type of logic circuits, each said logic circuit of the first type generating a pulse signal from an associated one of the clock signals included in the third multiphase clock received from the frequency dividing means and an inverted version of another one of the clock signals that has a phase shifted from the associated clock signal by the second phase difference, the pulse signal having a pulse width equal to the second phase difference and a period equal to a period of the third multiphase clock; and a second type of logic circuit for synthesizing the pulse signals output from the logic circuits of the first type.

8. The clock generator of claim 7, wherein the clock synthesizing means further comprises second selecting means that supplies first and second clock signals to each of the logic circuits of the first type, the first clock signal being one of the clock signals included in the third multiphase clock received from the frequency dividing means and being associated with the logic circuit of the first type, the second clock signal being complementary to a clock signal that has a phase shifted from the first clock signal by the second phase difference, and wherein each said logic circuit of the first type generates the pulse signal responsive to the first and second clock signals supplied from the second selecting means.

* * * * *